(12) United States Patent
Nishihara et al.

(10) Patent No.: US 9,513,382 B2
(45) Date of Patent: Dec. 6, 2016

(54) IMAGE-CAPTURING DEVICE AND ELECTRONIC DEVICE

(71) Applicant: Sony Corporation, Tokyo (JP)

(72) Inventors: Toshiyuki Nishihara, Kanagawa (JP); Hirofumi Sumi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 19 days.

(21) Appl. No.: 14/429,375

(22) PCT Filed: Aug. 15, 2013

(86) PCT No.: PCT/JP2013/071957
§ 371 (c)(1),
(2) Date: Mar. 19, 2015

(87) PCT Pub. No.: WO2014/050343
PCT Pub. Date: Apr. 3, 2014

(65) Prior Publication Data
US 2015/0226865 A1 Aug. 13, 2015

(30) Foreign Application Priority Data

Sep. 26, 2012 (JP) ................. 2012-211920

(51) Int. Cl.
| H01L 27/146 | (2006.01) |
| H04N 5/376 | (2011.01) |
| H04N 5/378 | (2011.01) |
| G01T 1/20 | (2006.01) |

(52) U.S. Cl.
CPC ....... *G01T 1/2018* (2013.01); *H01L 27/14609* (2013.01); *H01L 27/14663* (2013.01); *H04N 5/376* (2013.01); *H04N 5/378* (2013.01)

(58) Field of Classification Search
CPC ............. G01T 1/2018; H01L 27/14609; H01L 27/14663; H04N 5/376; H04N 5/378
See application file for complete search history.

(56) References Cited

U.S. PATENT DOCUMENTS

2011/0080510 A1 4/2011 Nishihara

FOREIGN PATENT DOCUMENTS

JP 2011-097581 A 5/2011

*Primary Examiner* — Mark R Gaworecki
(74) *Attorney, Agent, or Firm* — Wolf, Greenfield & Sacks, P.C.

(57) ABSTRACT

To improve a temporal resolution.
An image-capturing device includes a pixel array unit and a control unit. The pixel array unit includes a plurality of pixels classified into two or more groups, wherein pixels which belong to a same group are driven at a same timing. The control unit controls driving of the pixel array unit so that a number of groups in a period of time of read-out of electrical charge is a same number in any given timing in image-capturing operation, and that a number of groups in a period of time of exposure and accumulation of electrical charge is a same number in any given timing in the image-capturing operation.

8 Claims, 14 Drawing Sheets

FIG. 8
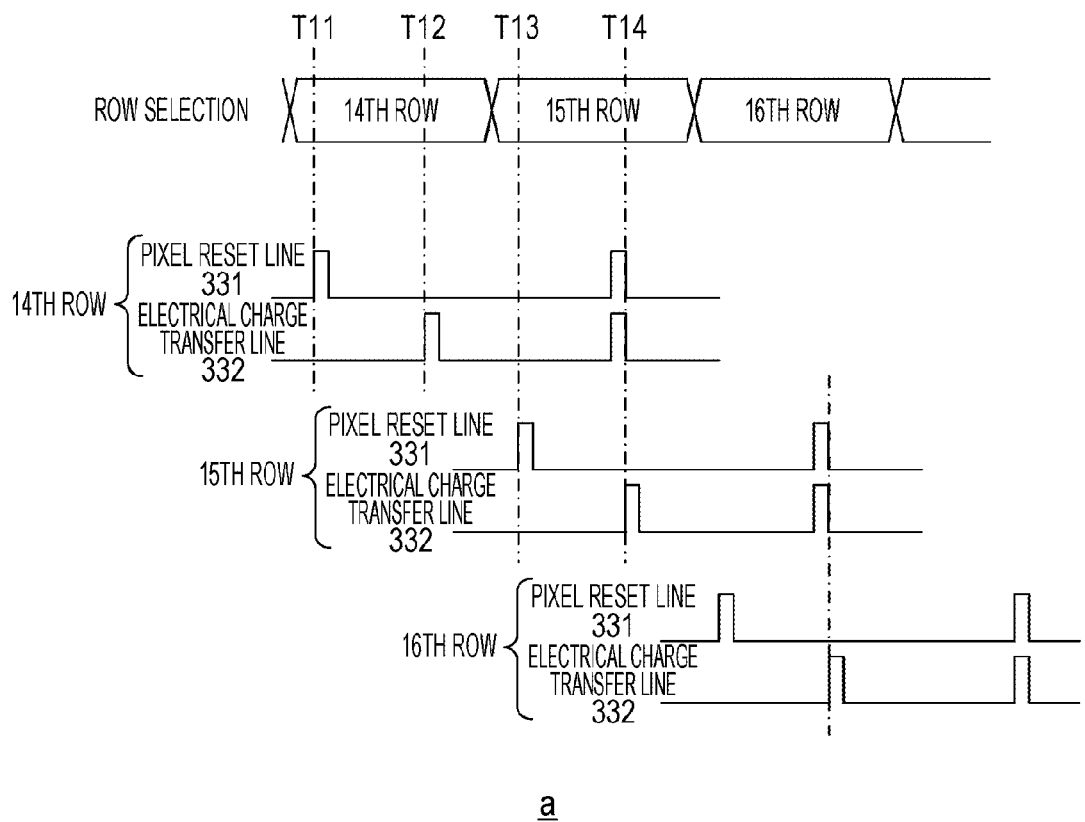
a
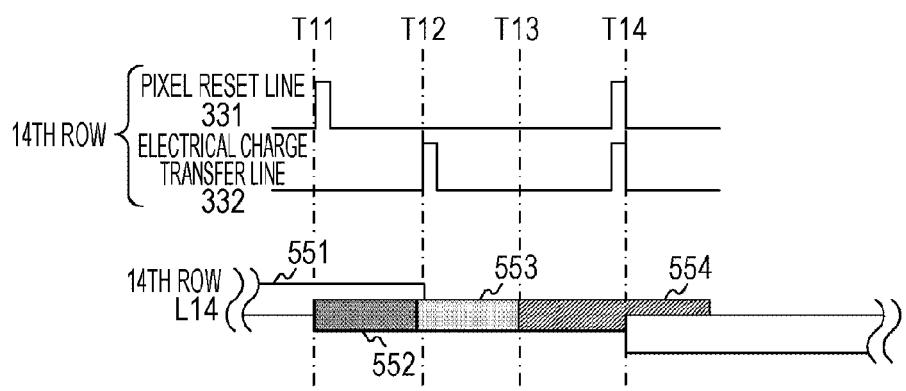
b

FIG. 10
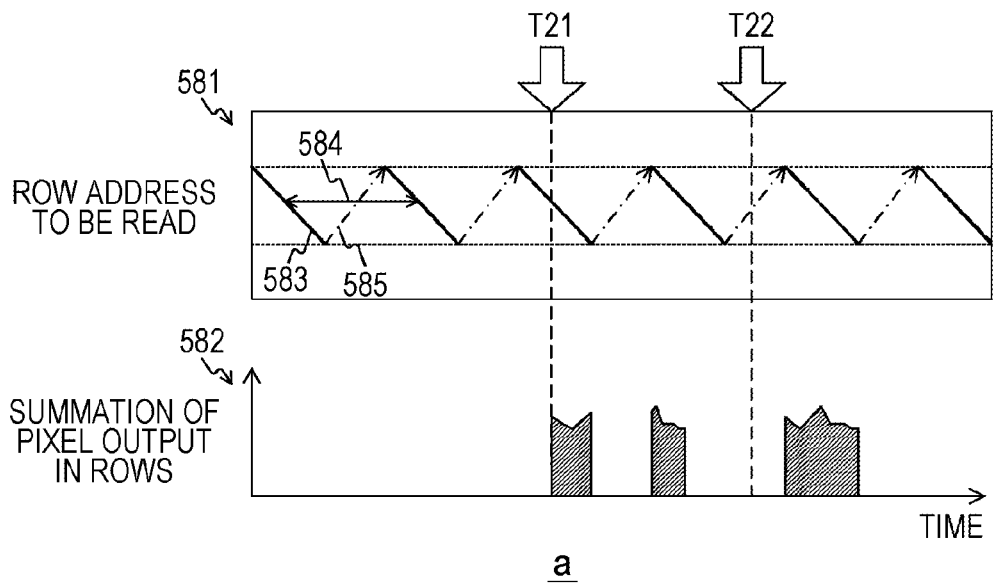
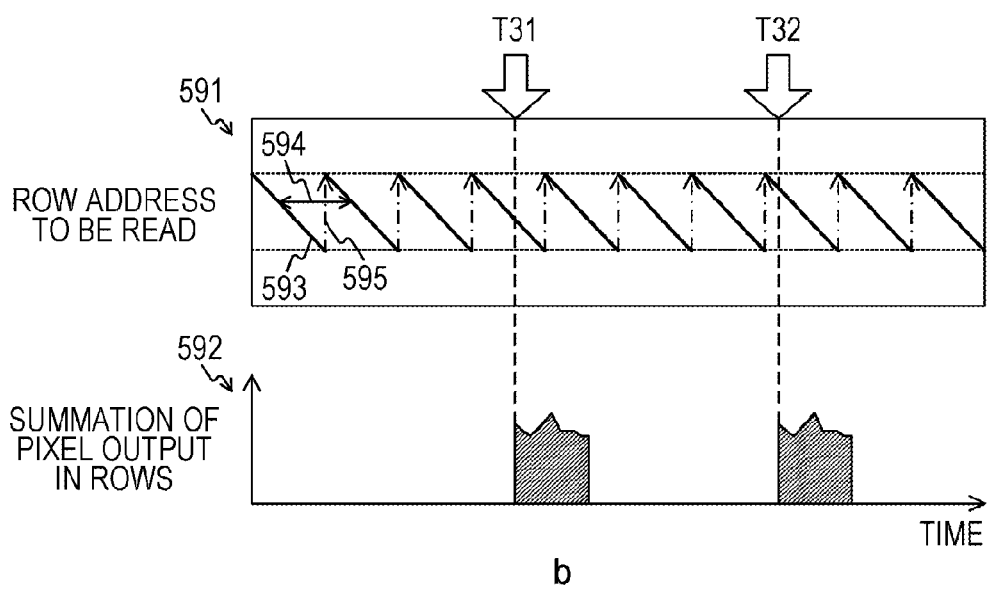

FIG. 11
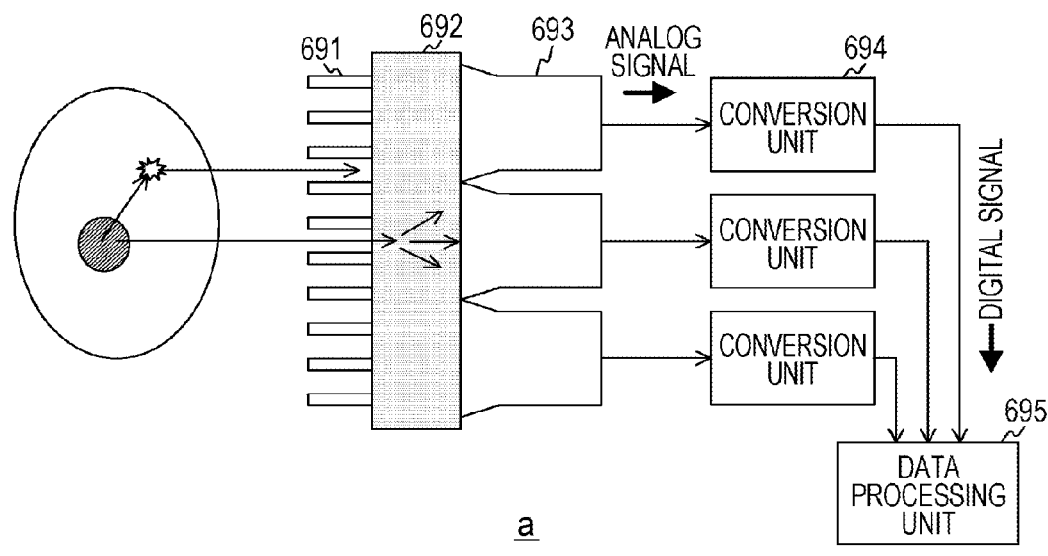
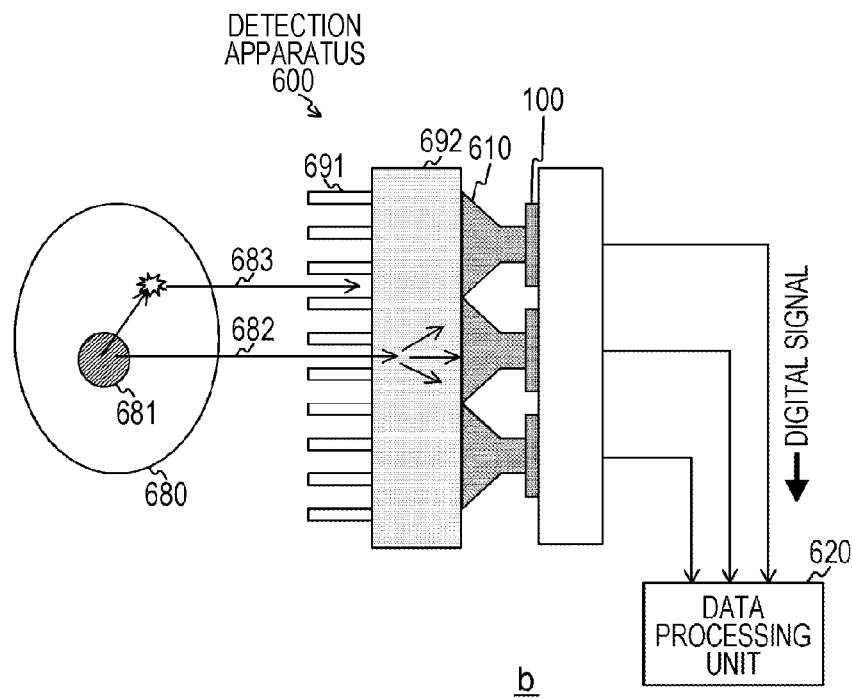

IMAGE-CAPTURING DEVICE AND ELECTRONIC DEVICE

CROSS-REFERENCE TO RELATED APPLICATIONS

This application is the National Stage of International Application No. PCT/JP2013/071957, filed in the Japanese Patent Office as a Receiving Office on Aug. 15, 2013, which claims priority to Japanese Patent Application Number 2012-211920, filed in the Japanese Patent Office on Sep. 26, 2012, each of which is hereby incorporated by reference in its entirety.

TECHNICAL FIELD

The present technique relates to an image-capturing device. More specifically, the present technique relates to an image-capturing device for detecting weak light and an electronic device having the same.

BACKGROUND ART

In recent years, apparatuses for detecting weak light are widely introduced to mainly medical scenes and research and development scenes. In such apparatus, a relatively expensive photomultiplier is often used as a detection unit of weak light.

Instead of the photomultiplier, an apparatus for detecting weak light by using a CMOS (Complementary Metal Oxide Semiconductor) image sensor that can be produced at a low cost has also been suggested (for example, see Patent Document 1).

CITATION LIST

Patent Document

Patent Document 1: Japanese Patent Application Laid-Open No. 2011-97581

SUMMARY OF THE INVENTION

Problems to be Solved by the Invention

In the background art explained above, the number of photons incident upon each pixel of the CMOS image sensor is counted (photon counting), whereby the weak light is detected.

This CMOS image sensor can also be used to detect scintillation light generated by incidence of radiation upon a scintillator. In this case, a number of photons are generated at the same time according to the energy of radiation (for example, one photon of gamma ray) incident upon the scintillator, and the number of photons according to this energy is detected by the CMOS image sensor. More specifically, the CMOS image sensor performing photon counting for detecting presence/absence of incidence of photons needs to increase the temporal resolution of light detection so that the scintillation light generated by photons of multiple gamma rays does not incident in the same exposure time.

In the CMOS image sensor, the temporal resolution of the light detection is defined by a frame rate; therefore, it is important to drive a pixel appropriately for photon counting by increasing the frame rate.

The present technique is made in view of such circumstances, and it is an object of the present technique to improve the temporal resolution.

Solutions to Problems

The present technique is made to solve the above-described problem and a first aspect thereof is an image-capturing device including: a pixel array unit including a plurality of pixels classified into two or more groups, wherein pixels which belong to a same group are driven at a same timing; and a control unit configured to control driving of the pixel array unit so that a number of groups in a period of time of read-out of electrical charge is a same number in any given timing in image-capturing operation, and that a number of groups in a period of time of exposure and accumulation of electrical charge is a same number in any given timing in the image-capturing operation. Therefore, there is an effect of driving the pixel array unit of the image-capturing device so that the number of groups in the period of time of read-out of electrical charge is the same number in any given timing in the image-capturing operation, and that the number of groups in the period of time of exposure and accumulation of electrical charge is a same number in any given timing in the image-capturing operation.

Further, in the first aspect, the group may be configured such that a number of pixels which belong to the group is substantially the same as the number of pixels which belong to another group. Therefore, there is such effect that the groups have substantially the same number of pixels.

Further, in the first aspect, the plurality of pixels may be configured to arrange in a row/column form in the pixel array unit and driven in a unit of row, and the control unit may be configured to perform the control with the row being adopted as a unit of the group. Therefore, there is an effect of driving each row.

Further, in the first aspect, the control unit may be configured to update a driving row address for designating a driving target row on every predetermined period of time, and perform the control on the basis of update timing of the driving row address thus updated. Therefore, control is performed to update the driving row address for designating the driving target row on every predetermined period of time, and perform the control on the basis of update timing of the driving row address thus updated.

Further, in the first aspect, the control unit may be configured to update the driving row address with a row address of a start of driving in a case where the update is performed in a state where the driving row address indicates a row address of an end of driving, on the basis of start row address information indicating the row address of the start of the driving and end row address information indicating the row address of the end of the driving. Therefore, there is such effect that the driving row address is updated with the row address of the start of the driving in the case where the update is performed in the state where the driving row address indicates the row address of the end of the driving, on the basis of start row address information indicating the row address of the start of the driving and end row address information indicating the row address of the end of the driving.

Further, in the first aspect, the control unit may be configured to perform the control so that an end timing of exposure in a driving target row in a current read-out operation and a start timing of a subsequent exposure in the driving target row in a previous read-out operation are substantially the same timing. Therefore, there is such effect that the end time of exposure in the driving target row in the current read-out operation and the start time of the subsequent exposure in the driving target row in the previous read-out operation become substantially the same time.

Further, in the first aspect, a determination unit may be configured to convert a pixel signal which is output from the pixel into a digital value, compare the converted digital value with a threshold value, and perform binary determination to determine presence/absence of incidence of a photon onto a pixel generating the pixel signal. Therefore, there is such effect that binary determination is performed to determine presence/absence of incidence of a photon onto a pixel generating the pixel signal.

Further, in the first aspect, the pixel array unit may be configured to receive light that is uniformized by a light uniformization unit for substantially uniformizing distribution of incidence light, which is a detection target of the number of photons, in a direction perpendicular to an optical axis. Therefore, there is such effect that light uniformized by the light uniformization unit is received.

Further, a second aspect of the present technique is an electronic device includes: a pixel array unit including a plurality of pixels classified into two or more groups, wherein pixels which belong to a same group are driven at a same timing; and a control unit configured to control driving of the pixel array unit so that a number of groups in a period of time of read-out of electrical charge is a same number in any given timing in image-capturing operation, and that a number of groups in a period of time of exposure and accumulation of electrical charge is a same number in any given timing in the image-capturing operation. Therefore, there is an effect of driving the pixel array unit of the image-capturing device so that the number of groups in the period of time of read-out of electrical charge is the same number in any given timing in the image-capturing operation, and that the number of groups in the period of time of exposure and accumulation of electrical charge is a same number in any given timing in the image-capturing operation.

Further, in the second aspect, the electronic device may further include: a scintillator configured to provide scintillation light generated in response to incidence of radiation to the pixel array unit; a determination unit configured to convert a pixel signal which is output from the pixel into a digital value, compared the converted digital value with a threshold value, and perform binary determination to determine presence/absence of incidence of a photon onto a pixel generating the pixel signal; and a calculation unit configured to derive a summation of binary values which are results of the binary determinations, for each of scintillation lights detected substantially at the same timing, and calculate an amount of energy of the radiation from the summation value. Therefore, there is such effect that the amount of energy of radiation is calculated on the basis of the binary determination result indicating the presence/absence of incidence of a photon onto a pixel.

Effects of the Invention

According to the present technique, there is a superior advantage of capable of improving the temporal resolution.

BRIEF DESCRIPTION OF DRAWINGS

FIGS. 8a and 8b are figures schematically illustrating an example of signals in signal lines (a pixel reset line 331 and an electrical charge transfer line 332) driving pixel when the image-capturing device 100 according to the first embodiment of the present technique is driven with operation timing as shown in FIG. 7.

FIGS. 10a and 10b are figures schematically illustrating an example of the exposure operation and the read-out operation performed by the image-capturing device 100 according to the first embodiment of the present technique and an example of an exposure operation and a read-out operation performed by another image-capturing device.

FIGS. 11a and 11b are figures schematically illustrating an example of a detection apparatus (detection apparatus 600) having the image-capturing device 100 according to the first embodiment of the present technique and an example of a conventional detection apparatus having a photomultiplier.

MODE FOR CARRYING OUT THE INVENTION

Hereinafter, embodiments for carrying out the present technique (hereinafter referred to as embodiments) will be explained. The explanation will be given in the following order.

1. First embodiment (image-capturing control: example of image-capturing device driven on the basis of row addresses generated in a circulating manner)

2. Second embodiment (image-capturing control: example of automatic exposure adjustment of image-capturing device driven on the basis of row addresses generated in a circulating manner)

1. First Embodiment

Example of Configuration of Image-Capturing Device

Figure 1:
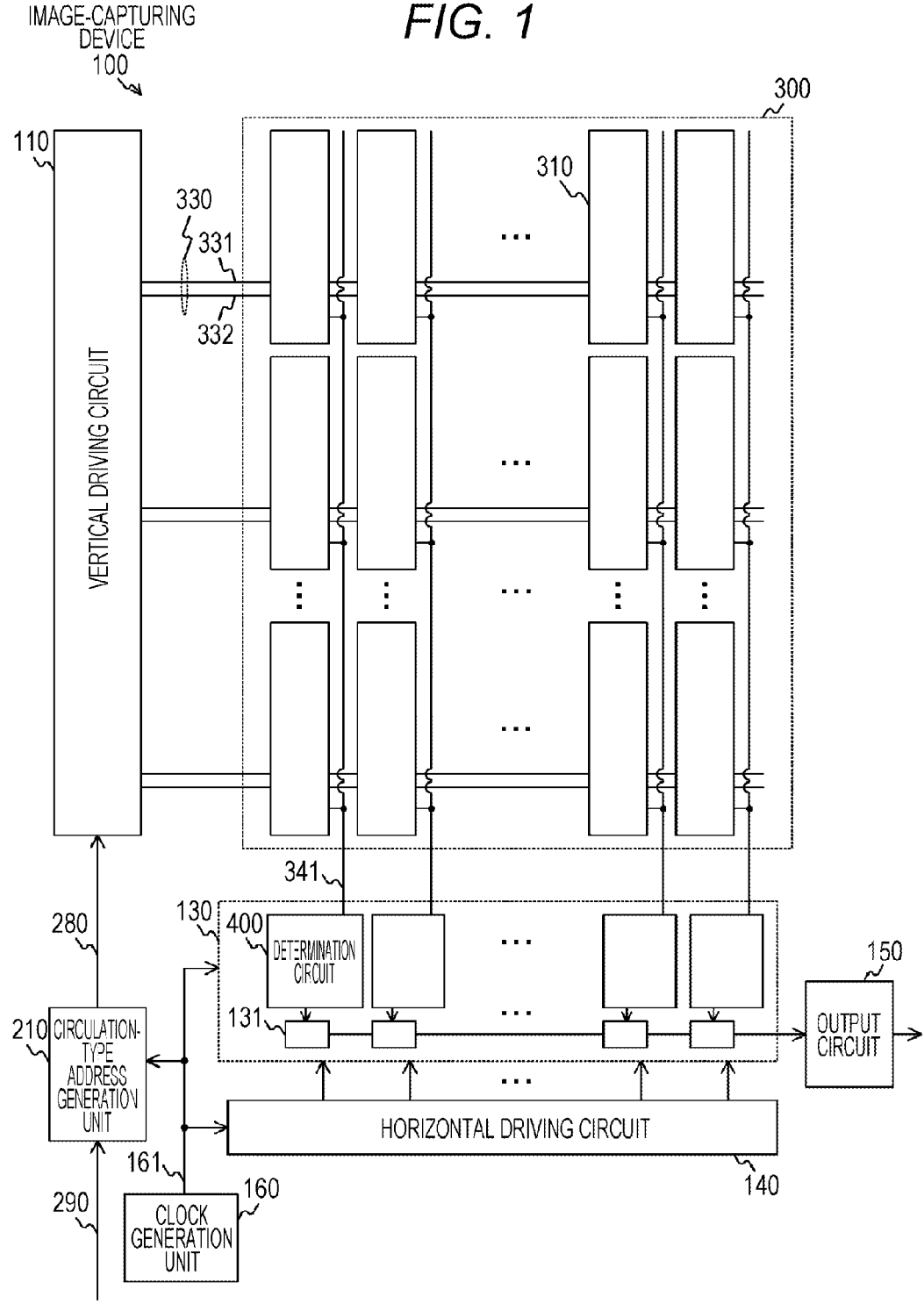
FIG. 1 is a conceptual diagram illustrating an example of a basic configuration example of an image-capturing device 100 according to a first embodiment of the present technique.

FIG. 1 is a conceptual diagram illustrating an example of a basic configuration example of an image-capturing device 100 according to the first embodiment of the present technique.

The image-capturing device 100 is an optical detector provided in a system for detecting weak light (for example, a fluorescent scanner of an imaging plate, scintillation counter of radiation, and the like). This image-capturing device 100 is realized by, for example, a CMOS (Complementary Metal Oxide Semiconductor) sensor. The image-capturing device 100 is used instead of a conventional photomultiplier, avalanche photodiode, photodiode, or the like.

In the explanation about this case, the image-capturing device 100 is assumed to be used for detection of photon counting of radiation. More specifically, in the following explanation, the image-capturing device 100 is assumed to detect fluorescence (scintillation light) generated by radiation incident upon the scintillator (for example, gamma ray).

In FIG. 1, in order to increase the speed of read-out, an image-capturing device having a less number of rows by having a photodiode in a rectangular shape elongated in the column direction will be explained.

The image-capturing device 100 includes a pixel array unit 300, a vertical driving circuit 110, a read-out circuit 130, a horizontal driving circuit 140, an output circuit 150, a clock generation unit 160, and a circulation-type address generation unit 210.

The pixel array unit 300 includes multiple pixels (pixels 310) arranged in a two-dimensional matrix form (n by m). In the first embodiment of the present technique, the pixels 310 in 32 rows by 128 columns are assumed to be arranged in the pixel array unit 300. The pixel array unit 300 as shown in FIG. 1 shows some of the pixels 310 in 32 rows by 128 columns. The pixels 310 arranged in the pixel array unit 300 arranged with control lines (control lines 330) extending from the vertical driving circuit 110 in units of rows. The pixels 310 are arranged with vertical signal lines (vertical signal lines 341) in units of columns. The pixel 310 is in a rectangular shape of which vertical/horizontal ratio (column direction:row direction) is substantially 4:1. The pixels 310 in such shape are arranged in 32 rows by 128 columns; therefore the pixel array unit 300 is substantially in a square shape. It should be noted that the circuit configuration of the pixel 310 will be later explained with reference to FIG. 2, and explanation about the pixel 310 is omitted here.

The clock generation unit 160 generates a clock serving as a reference of timing for switching a target row (driving target row) which is driven by the vertical driving circuit 110 and from which a signal is read out. The frequency of the clock generated by this clock generation unit 160 is set on the basis of a length of a time (a period of time for read-out) required to read out a signal from the pixel 310 arranged in the pixel array unit 300. More specifically, the clock generation unit 160 generates a clock of a certain frequency regardless of an operation condition of the image-capturing device 100 (the magnitude of the number of driving target rows).

The clock generated by the clock generation unit 160 is also used as a reference of operation timing when signals read out from a pixel in a row of driving target (read-out target of signal) are processed. The clock generation unit 160 provides the generated clock via a signal line 161 to a circulation-type address generation unit 210, a read-out circuit 130, and a horizontal driving circuit 140.

The vertical driving circuit 110 provides a signal via the control line 330 to the pixels 310, and selects and scans the pixels 310 in units of rows in order in the vertical direction (column direction). The vertical driving circuit 110 performs selection and scanning in units of rows, so that the signals are output from the pixels 310 in units of rows. It should be noted that the control line 330 includes a pixel reset line 331 and an electrical charge transfer line 332. The pixel reset line 331 and the electrical charge transfer line 332 will be later explained with reference to FIG. 2; therefore explanation about the pixel reset line 331 and the electrical charge transfer line 332 is omitted here.

The read-out circuit 130 performs various kinds of signal processing on pixel signals, which are output from the pixel array unit 300, for each pixel column. More specifically, the read-out circuit 130 performs various kinds of signal processing (for example, noise reduction, binary determination) on pixel signals which are output via the vertical signal line 341 from a pixel in a row selected by the vertical driving circuit 110. It should be noted that the read-out circuit 130 determines each operation timing using, as the reference, the clock provided from the clock generation unit 160 via the signal line 161. For example, each operation timing is determined such as starting binary determination processing after how many microseconds after the rise of the pulse of the clock of the signal line 161 (how many counts after another clock). The read-out circuit 130 includes a determination circuit 400 and a register 131 for each column of pixels (for each vertical signal line 341).

The determination circuit 400 determines whether a photon is incident upon the pixel 310 on the basis of the output signal provided from the pixel 310 (binary determination). This determination circuit 400 is provided for each vertical signal line 341. More specifically, the image-capturing device 100 includes 128 determination circuits 400 respectively connected to 128 vertical signal lines 341 wired to pixels (32 rows by 128 columns) driven by the vertical driving circuit 110. The determination circuit 400 provides a determination result to the register 131 connected to each determination circuit 400.

The register 131 is provided for each determination circuit 400, and is configured to temporarily hold a determination result provided from the determination circuit 400. This register 131 successively outputs the held determination result to the output circuit 150 in a period of time in which a signal in a row subsequent to the pixel is being read out (the period of time of read-out).

The horizontal driving circuit 140 successively selects and scans a circuit portion for each pixel column in the read-out circuit 130. The horizontal driving circuit 140 includes, for example, a shift register and an address decoder. The horizontal driving circuit 140 successively selects and scans a circuit portion of the read-out circuit 130, so that an electric signal for each pixel having been subjected to signal processing for each pixel column in the read-out circuit 130 is successively output to the output circuit 150.

The output circuit 150 outputs a signal generated by the image-capturing device 100 to an external circuit.

Figure 5:
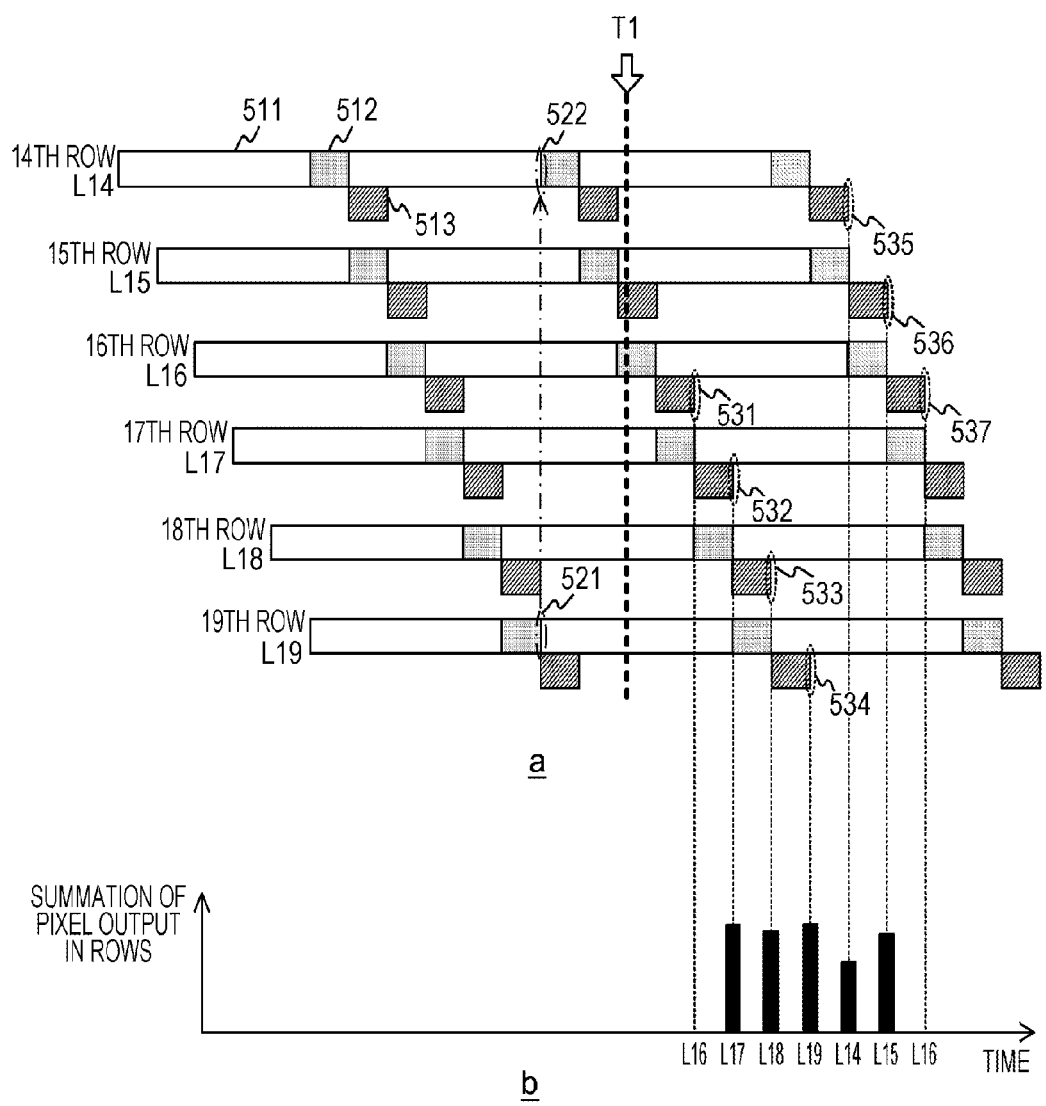
FIGS. 5a and 5b are figures schematically illustrating an example of a timing chart in a case where the image-capturing device 100 according to the first embodiment of the present technique is driven with six rows in a circulating manner.
Figure 6:
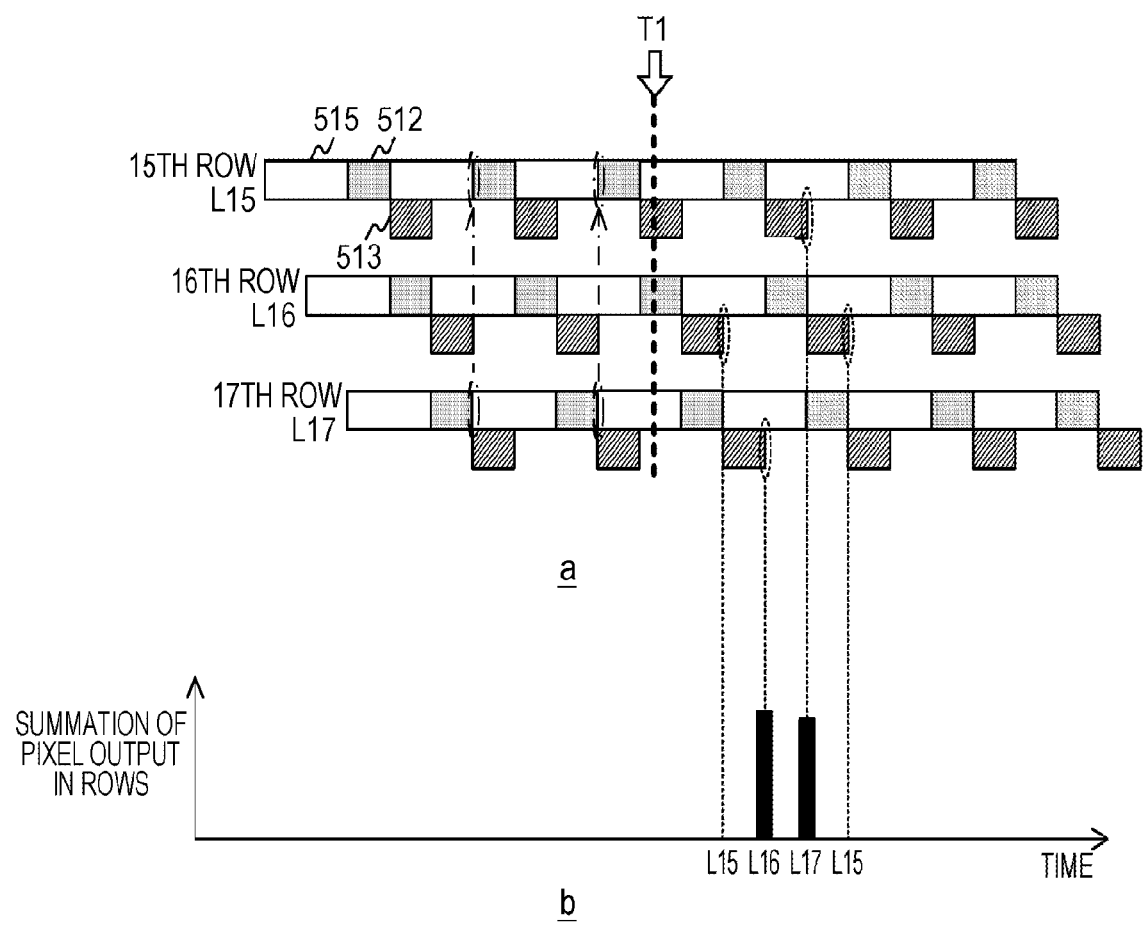
FIGS. 6a and 6b are figures schematically illustrating an example of a timing chart in a case where the image-capturing device 100 according to the first embodiment of the present technique is driven with three rows in a circulating manner.

The circulation-type address generation unit 210 generates an address (driving row address) designating a row of pixels driven by the vertical driving circuit 110 (driving target row). This circulation-type address generation unit 210 obtains a start row address and an end row address provided via a signal line 290 from a control circuit of operation in an apparatus in which the image-capturing device 100 is provided (for example, data processing unit 620 in FIG. 11). Then, the circulation-type address generation unit 210 generates driving row addresses so that the address circulates in row addresses from the start row address to the end row address. This circulation-type address generation unit 210 generates the driving row addresses in a circulating manner so that the image-capturing device 100 controls operation of the vertical driving circuit 110 so that only the same number of pixels are always exposed at any given timing. More specifically, the image-capturing device 100 drives pixels in such a manner that there is always a single row of pixels in read-out operation at any given timing, and the number of rows of pixels being exposed at any given timing is the same. This exposure operation will be later explained with reference to FIGS. 5 and 6; therefore explanation about the exposure operation is omitted here.

The circulation-type address generation unit 210 provides the generated driving row address via the signal line 280 to the vertical driving circuit 110. The circulation-type address generation unit 210, the vertical driving circuit 110, the read-out circuit 130, and the horizontal driving circuit 140 are an example of a control unit as described in the claims.

In this case, a time required to read out signals from pixels in a single row (the period of time of read-out) is assumed to be five microseconds, and based on this assumption, the operation of the image-capturing device 100 will be explained. The image-capturing device 100 operates in such a manner that the number of rows of pixels being exposed is always the same at any given timing; therefore, the period of time of read-out defines a time allocated to other operations (such as exposure, transfer of a signal, and the like) (unit period of time). For example, when all of 32 rows are driven, the time for the operation of obtaining signals of all of the pixels in 32 rows (a time in which the processing is performed for a single circulation) is 160 microseconds (five microseconds multiplied by 32 rows). In a case where all of the 32 rows are driven, the exposure time is 155 microseconds (160 microseconds–five microseconds).

When only some of the 32 rows are driven, the time in which the processing is performed for a single circulation is a time according to the number of rows. For example, when only two rows are driven, the time in which the processing is performed for a single circulation is 10 microseconds (five microseconds multiplied by two rows), and the exposure time is five microseconds (ten microseconds–five microseconds). When only six rows are driven, the time in which the processing is performed for a single circulation is 30 microseconds (five microseconds multiplied by six rows), and the exposure time is 25 microseconds (30 microseconds–five microseconds).

Subsequently, an example of a circuit configuration of the pixel 310 will be explained with reference to FIG. 2.

[Circuit Example of Configuration of Circuit of Pixel]

Figure 2:
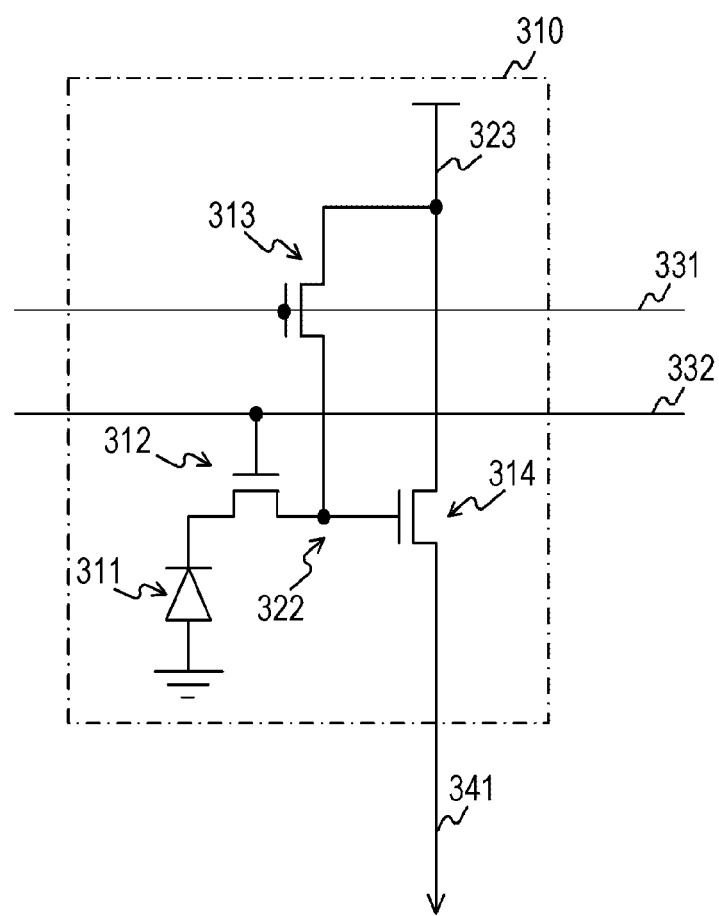
FIG. 2 is a schematic diagram illustrating an example of a circuit configuration of a pixel 310 according to the first embodiment of the present technique.

FIG. 2 is a schematic diagram illustrating an example of a circuit configuration of the pixel 310 according to the first embodiment of the present technique.

The pixel 310 performs photoelectric conversion to convert an optical signal, which is an incident light, into an electric signal. The pixel 310 amplifies the converted electric signal, and outputs the electric signal as a pixel signal. For example, this pixel 310 amplifies the electric signal using an FD amplifier having a floating diffusion (FD) layer.

The pixel 310 includes a photodiode 311, a transfer transistor 312, a reset transistor 313, and an amplifier transistor 314.

In pixel 310, the anode terminal of the photodiode 311 is grounded, and the cathode terminal of the photodiode 311 is connected to the source terminal of the transfer transistor 312. The gate terminal of the transfer transistor 312 is connected to an electrical charge transfer line 332, and the drain terminal of the transfer transistor 312 is connected via the floating diffusion (FD 322) to the source terminal of the reset transistor 313 and the gate terminal of the amplifier transistor 314.

The gate terminal of the reset transistor 313 is connected to the pixel reset line 331, and the drain terminal of the reset transistor 313 is connected to the electric power supply line 323 and the drain terminal of the amplifier transistor 314. The source terminal of the amplifier transistor 314 is connected to the vertical signal line 341.

The photodiode 311 is a photoelectric conversion device generating an electrical charge according to the strength of light. This photodiode 311 generates a pair of electron and hole in response to a photon incident upon the photodiode 311, and in this case, the electron thus generated is accumulated.

The transfer transistor 312 transfers electrons generated in the photodiode 311 to the FD 322 in accordance with a signal from the vertical driving circuit 110 (transfer pulse). For example, when a signal (pulse) is provided from the electrical charge transfer line 332 provided to the gate terminal of the transfer transistor 312, this transfer transistor 312 attains a conductive state, so that the electrons generated in the photodiode 311 are transferred to the FD 322.

The reset transistor 313 is configured to reset the potential of the FD 322 in accordance with a signal provided from the vertical driving circuit 110 (reset pulse). When the reset pulse is provided to the gate terminal via the pixel reset line 331, the reset transistor 313 attains a conductive state, so that an electric current flows from the FD 322 to the electric power supply line 323. Accordingly, the electrons accumulated in the floating diffusion (FD 322) are drawn to the electric power supply, whereby the floating diffusion is reset (hereinafter, the potential at this occasion will be referred to as a reset potential). When the photodiode 311 is reset, the transfer transistor 312 and the reset transistor 313 attain the conductive state at a time. Therefore, the electrons accumulated in the photodiode 311 are drawn to the electric power supply, and the photons are reset to non-incident state (dark state). The potential flowing to the electric power supply line 323 (electric power supply) is an electric power supply used for the reset and the source follower, and, for example, 3 V is provided.

The amplifier transistor 314 is configured to amplify the potential of the floating diffusion (FD 322), and output a signal (output signal) according to the amplified potential to the vertical signal line 341. In a state where the potential of the floating diffusion (FD 322) is reset (in a case of the reset potential), the amplifier transistor 314 amplifies the output signal according to the reset potential (which will be hereinafter referred to as a reset signal) to the vertical signal line 341. When the electrons accumulated in the photodiode 311 are transferred to the FD 322, the amplifier transistor 314 outputs an output signal according to the amount of electrons thus transferred (which will be hereinafter referred to as an accumulation signal) to the vertical signal line 341. When the vertical signal line 341 is shared by multiple pixels as shown in FIG. 1, a selection transistor for each pixel may be interposed between the amplifier transistor 314 and the vertical signal line 341.

The basic circuit and operation mechanism of the pixel as shown in FIG. 2 is the same as a normal pixel, and various other variations may be considered. However, the pixel expected in the present technique is designed to achieve significantly higher conversion efficiency than a conventional pixel. In order to do this, the pixel is designed so that the parasitic capacitance (the parasitic capacitance of the FD 322) of the gate terminal of the amplifier (amplifier transistor 314) constituting the source follower becomes a virtually extremely small level. This design can be done by, e.g., a method of improving the layout or a method of feeding back the output of the source follower into the circuit in the pixel (for example, see Japanese Patent Laid-Open No. 5-63468, Japanese Patent Laid-Open No. 2011-119441).

As described above, the parasitic capacitance is reduced, so that a contrivance is made to output a sufficiently large output signal to the vertical signal line 341 even when fewer electrons are accumulated in the FD 322. The magnitude of the output signal may be sufficiently larger than the random noise of the amplifier transistor 314. When the output signal produced in response to accumulation of a single photon into the FD 322 is sufficiently larger than the random noise of the amplifier transistor 314, the signal from the pixel is quantized, and the number of accumulation photons of the pixel can be detected as a digital signal.

For example, when the random noise of the amplifier transistor 314 is 50 µV to 100 µV, and the conversion efficiency of the output signal is increased to about 600 µV/e, the output signal is sufficiently higher than the random noise; therefore, a single photon can be detected in principle.

When binary determination is performed on presence/absence of photon incidence during the unit period of time of exposure and the result is digitally output, the noise generated after the output of the output signal by the amplifier transistor 314 can be reduced to substantially zero. For example, when binary determination is performed on a pixel array having 32 rows by 128 columns, photon counting can be done on 4096 (32 by 128) photons at most.

In FIG. 2, the example of the pixel that is designed to have a parasitic capacitance reduced to virtually extremely small level to be able to detect a single photon has been explained, but the embodiment is not limited thereto. Alternatively, the embodiment can also be carried out with a pixel that amplifies, within the pixel, the electron obtained from the photoelectric conversion. For example, a pixel may be considered in which multiple stages of CCD multiplier transfer devices are embedded between the photodiode in the pixel and the gate terminal of the amplifier transistor (for example, see Japanese Patent Laid-Open No. 2008-35015). In this pixel, the electron photoelectrically converted is multiplied about ten times within the pixel. As described above, a single photon can also be detected by multiplying the electron within the pixel, and the image-capturing device having such pixels arranged therein may also be used as the image-capturing device 100.

Figure 3:
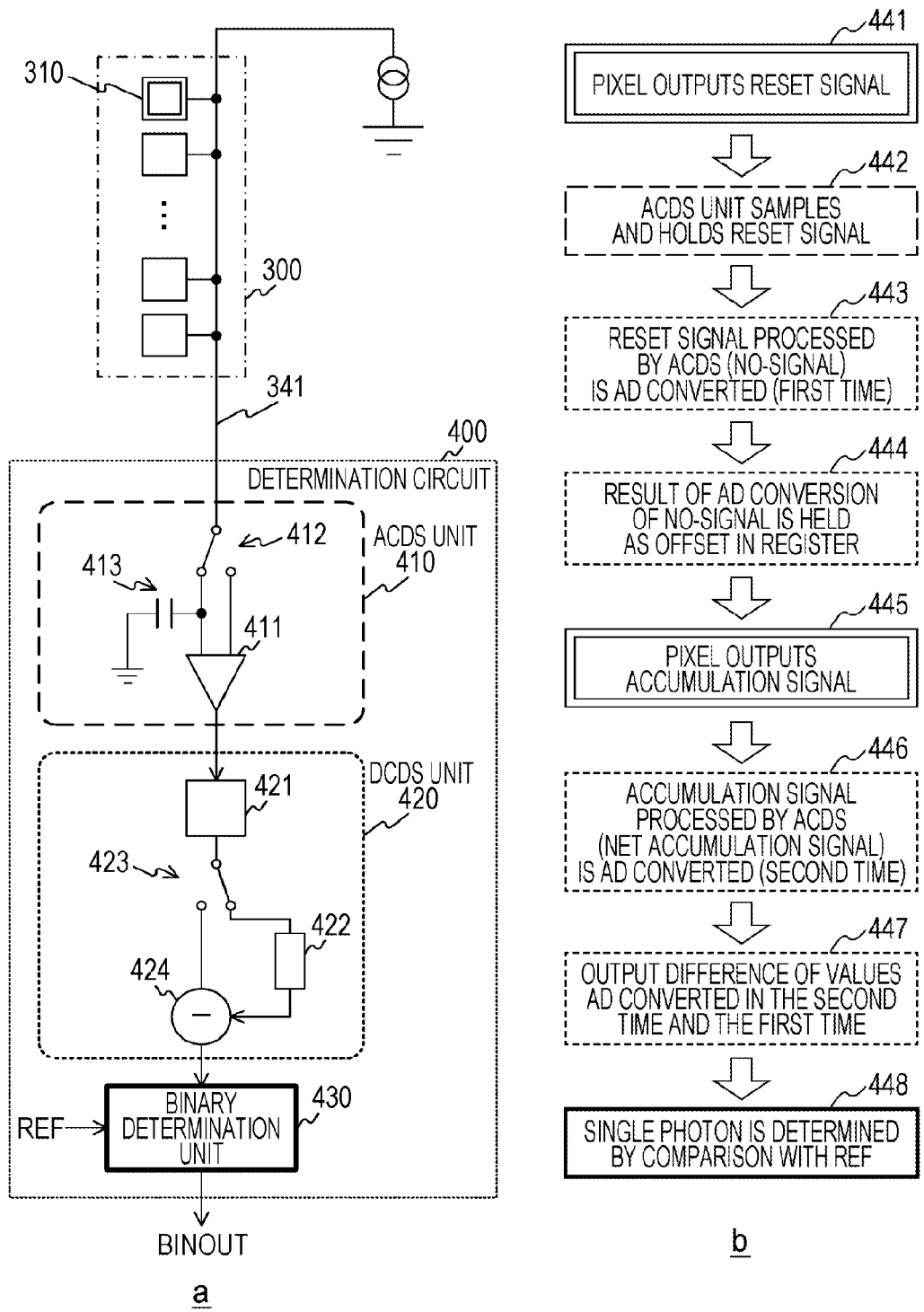
FIGS. 3a and 3b are conceptual diagrams illustrating an example of a functional configuration of a determination circuit 400 and an example of operation of the determination circuit 400 according to the first embodiment of the present technique.

Subsequently, the determination circuit 400 for determining presence/absence of incidence of photon to the pixel 310 on the basis of an output signal provided from the pixel 310 will be explained with reference to FIGS. 3a and 3b.

[Example of Configuration of Functions of Determination Circuit]

FIGS. 3a and 3b are conceptual diagrams illustrating an example of a functional configuration of the determination circuit 400 and an example of operation of the determination circuit 400 according to the first embodiment of the present technique.

FIG. 3a shows an ACDS (Analog Correlated Double Sampling) unit 410, a DCDS (Digital CDS) unit 420, and a binary determination unit 430 which serve as the functional configuration of the determination circuit 400.

FIG. 3a also shows the vertical signal line 341 connected to the determination circuit 400 and some of the pixels 310 connected to the vertical signal line 341, and the pixel array unit 300, which are shown together with the functional configuration of the determination circuit 400.

The ACDS unit 410 performs offset elimination using an analog CDS, and includes a switch 412, a capacitor 413, and a comparator 411.

The switch 412 is a switch for connecting the vertical signal line 341 to any of an input terminal for inputting a reference voltage into the comparator 411 and an input terminal for input a comparison target signal into the comparator 411. When the reset signal of the pixel 310 is sampled and held, the switch 412 connects the vertical signal line 341 to the input terminal for inputting the reference voltage (the terminal at the left side to which the capacitor 413 is connected). When the comparator 411 outputs a result of analog CDS, the switch 412 connects the vertical signal line 341 to the input terminal for inputting the comparison target signal (the terminal at the right side that does not have the capacitor).

The capacitor 413 is a holding capacity for sampling and holding the reset signal of the pixel 310.

The comparator 411 is configured to output a difference between the sampled and held signal and the comparison target signal. More specifically, the comparator 411 outputs a difference between the sampled and held reset signal and the signal provided from the vertical signal line 341 (the accumulation signal or the reset signal). This means that the comparator 411 outputs a signal from which noise generated by the pixel 310 such as kTC noise has been eliminated. The comparator 411 is realized by, for example, an operation amplifier having a gain of factor one. The comparator 411 provides a difference signal to the DCDS unit 420. In this case, a difference signal between the reset signal and the reset signal will be referred to as no-signal, and a difference signal between the reset signal and the accumulation signal will be referred to as a net accumulation signal.

The DCDS unit 420 is configured to perform noise reduction using digital CDS, and includes an AD (Analog Digital) conversion unit 421, a register 422, a switch 423, and a subtractor 424.

The AD conversion unit 421 is configured to perform AD conversion to convert a signal provided from the comparator 411.

The switch 423 is a switch for switching the supply destination of the AD converted signal generated by the AD conversion unit 421. When the AD conversion unit 421 outputs a result of the AD conversion of no-signal (no-signal in digital), the switch 423 provides this signal to the register 422 to cause the register 422 to latch (hold) the result. Therefore, the value of the offset of the comparator 411 and the AD conversion unit 421 is held in the register 422. When the AD conversion unit 421 outputs a result of the AD conversion of a net accumulation signal (net accumulation signal in digital), the switch 423 provides this signal to the subtractor 424.

The register 422 is configured to hold the result of the AD conversion of no-signal. The register 422 provides the result of the AD conversion of no-signal held therein (no-signal in digital) to the subtractor 424.

The subtractor 424 is configured to subtract the value of no-signal in digital from the value of the net accumulation signal in digital. The subtractor 424 provides the subtracted result (net digital value) to the binary determination unit 430.

The binary determination unit 430 is configured to perform binary determination (digital determination). The binary determination unit 430 performs binary determination as to presence/absence of incidence of photon to the pixel 310 by comparing the output of the subtractor 424 (net digital value) and the reference signal (REF), and outputs the determination result (indicated as "BINOUT" in FIGS. 3*a* and 3*b*).

Hereinafter, operation performed by the determination circuit 400 in a case where binary determination is performed on presence/absence of incidence of photon to a single pixel 310 will be explained with reference to FIG. 3*b*.

FIG. 3*b* shows a flowchart illustrating an example of operation example of the determination circuit 400. The frame of each procedure of the flowchart in FIG. 3*b* corresponds to the frame of each configuration shown in FIG. 3*a*. More specifically, a procedure indicated by a double frame indicates a procedure of the pixel 310, a procedure indicated by a frame of a long broken line indicates a procedure of the ACDS unit 410, a procedure indicated by a frame of a short broken line indicates a procedure of the DCDS unit 420, and a procedure indicated by a thick solid line indicates a procedure of the binary determination unit 430. For the sake of explanation, the ACDS processing performed by the ACDS unit 410 is not shown in the drawing, and will be explained together with a procedure in which the DCDS unit 420 performs the AD conversion.

First, in a pixel in a selected row (pixel 310), the potential of the gate terminal of the amplifier transistor 314 (the potential of the FD 322) is reset, and the reset signal is output to the vertical signal line 341 (step 441).

Subsequently, the reset signal which is output from the pixel 310 is sampled and held by the capacitor 413 of the ACDS unit 410 (step 442). Thereafter, a signal (no-signal) of difference between the sampled and held reset signal and the reset signal which is output from the pixel 310 is AD converted by the AD conversion unit 421 of the DCDS unit 420 (step 443). It should be noted that the no-signal thus AD converted involves noises generated by the comparator 411 and the AD conversion unit 421, and in this step, the value for cancelling (offsetting) these noises is digitally detected. Then, the result of the AD conversion of this no-signal is held as the offset value by the register 422 (step 444).

Subsequently, in the pixel 310, the electron accumulated by the photodiode 311 is transferred to the FD 322, and an accumulation signal is output from the pixel 310 (step 445). Thereafter, a signal (net accumulation signal) of difference between the sampled and held reset signal and the accumulation signal which is output from the pixel 310 is AD converted by the AD conversion unit 421 of the DCDS unit 420 (step 446). It should be noted that the result of this AD conversion involves noises generated by the comparator 411 and the AD conversion unit 421.

Then, the subtractor 424 outputs a value obtained by subtracting the value of the (first time) result of the AD conversion of no-signal held in the register 422 from the value of the (second time) result of the AD conversion of the net accumulation signal (step 447). Therefore, the noises (offset components) caused by the comparator 411 and the AD conversion unit 421 are cancelled, and the digital value (net digital value) of only the accumulation signal which is output by the pixel 310 is output.

Thereafter, the net digital value which is output from the subtractor 424 and the reference signal (REF) are compared by the binary determination unit 430 (step 448). The reference signal (REF) is set to a value around an intermediate value between the digital value of signal (no-signal) which is output by the pixel 310 when there is no photon incidence and the digital value of signal (no-signal) which is output by the pixel 310 when there is photon incidence (for example, "50" which is intermediate between "0" and "100" is the reference signal). When the value of the digital value which is output from the subtractor 424 (the digital value of only the accumulation signal which is output by the pixel 310) is more than the value of the reference signal (REF), a signal having a value "1" serving as "photon incidence is present" (BINOUT) is output. On the other hand, when the value of the digital value which is output from the subtractor 424 is not more than the value of the reference signal (REF), a signal having a value "0" serving as "photon incidence is absent" (BINOUT) is output. More specifically, the image-capturing device 100 outputs presence/absence of photon incidence as the digital value (0 or 1) of the binary determination result.

In the explanation about FIGS. 3*a* and 3*b*, two-value determination (binary determination) between "photon incidence is present" or "photon incidence is absent" is assumed to be performed, but it may be possible to determine two or more values by preparing multiple series of reference signals (REFs). For example, two series of reference signals (REFs) are prepared, and one series is set to an intermediate value between a digital value when the number of photons is "0" and a digital value when the number of photons is "1", and the other series is set to an intermediate value between a digital value when the number of photons is "1" and a digital value when the number of photons is "2". In this case, three types of determinations can be made, in which the number of photons are "0", "1", and "2", so that the dynamic range of the image-capturing process is improved. Such multi-value determination is greatly affected by, e.g., variation of the conversion efficiency of each pixel; therefore, it is necessary to perform the manufacturing process with a higher precision than the manufacturing process of the two-value determination. However, with regard to the point that the signal generated by a pixel is treated as a digital output, the multi-value determination is like the binary determination in which only presence/absence (0 or 1) of photon incidence from the signal generated by the pixel is determined.

As described above, in the image-capturing device 100, the signal that is output from the pixel 310 is determined by the determination circuit 113 as a digital value; therefore, the image-capturing device 100 is almost completely immune to noises generated in the transmission as compared with a conventional image-capturing device treating the signal as an analog output (1024 levels of gradation when it is made into 10-bit data).

Subsequently, the circulation-type address generation unit 210 will be explained with reference to FIG. 4.

[Example of Configuration of Functions of Circulation-Type Address Generation Unit]

Figure 4:
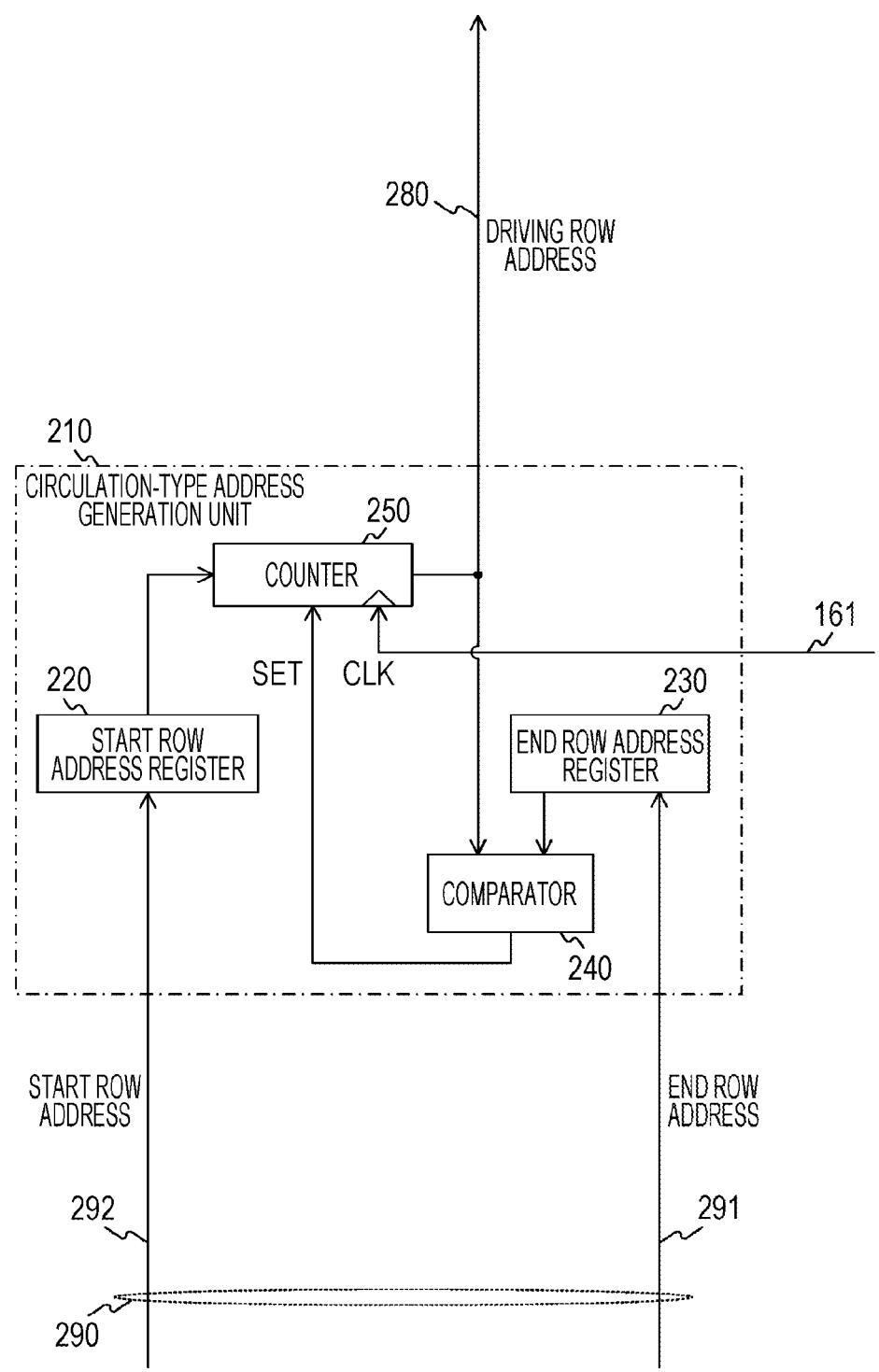
FIG. 4 is a figure illustrating an example of a functional configuration of a circulation-type address generation unit 210 according to the first embodiment of the present technique.

FIG. 4 is a figure illustrating an example of a functional configuration of the circulation-type address generation unit 210 according to the first embodiment of the present technique.

In FIG. 4, driven rows are considered to be continuous rows, and it is assumed that rows are not driven in an interlaced manner.

The circulation-type address generation unit 210 is configured to generate an address designating a row of pixels driven by the vertical driving circuit 110 (driving row address), and includes a start row address register 220, an end row address register 230, a comparator 240, and a counter 250.

The start row address register 220 is configured to temporarily hold the start row address provided via the signal line 292 of the signal lines 290. The start row address register 220 provides the held start row address to the counter 250.

The end row address register 230 is configured to temporarily hold the end row address provided via the signal line 291 of the signal lines 290. The end row address register 230 provided the held end row address to the comparator 240.

The comparator 240 compares the end row address provided from the end row address register 230 and the driving row address provided from the counter 250. When the end row address matches the driving row address, the comparator 240 provides the counter 250 with a signal (SET signal) for initializing the count value of the counter 250 (driving row address) with the value of the start row address provided from the start row address register 220.

The counter 250 is configured to count the clock provided via the signal line 161 (CLK signal), serving as timing for switching the driving target row, and output the value obtained by this counting (count value) as a driving row address. When the counter 250 receives a SET signal from the comparator 240, the count value is initialized with the value of the start row address. After the initialization, every time the counter 250 counts a single clock count of the clock of the signal line 161, the counter 250 increases the count value (driving row address) by one (increment), thus successively scanning the driving rows. Then, when the driving row address attains the end row address, the comparator 240 having detected it provides the SET signal, so that the count value is reset with the value of the start row address, and the driving row address circulates. The counter 250 provides information indicating the generated driving row address to the comparator 240 and the vertical driving circuit 110 via the signal line 280.

As described above, the circulation-type address generation unit 210 generates the driving row address in a circulating manner.

In other CMOS image-capturing devices, counting operation starts from the start row address (the first row in the embodiment of the present technique) in response to a trigger of a vertical synchronization signal (frame start signal) generated at the outside or the inside. Therefore, at any given timing, it is difficult to drive pixels so that there is a single row of pixels which are being subjected to the read-out operation. In the image-capturing device 100, the circulation-type address generation unit 210 generates the driving row addresses in a circulating manner; therefore, at any given timing, pixels can be driven so that there is a single row of pixels which are being subjected to the read-out operation.

Subsequently, the exposure operation and the read-out operation performed by the image-capturing device 100 will be explained with reference to FIG. 5 to FIG. 8.

[Example of Timing Chart in a Case where Driving is Performed with Pixels in Six Rows in a Circulating Manner]

FIGS. 5a and 5b are figures schematically illustrating an example of a timing chart in a case where the image-capturing device 100 according to the first embodiment of the present technique is driven in a circulating manner with six rows.

FIGS. 5a and 5b will be explained in which it is assumed to drive pixels in six rows arranged in the 14-th row to the 19-th row of the pixels in the pixel array unit 300 having 32 rows by 128 columns in the image-capturing device 100. A case where the number of driving target rows is less than six rows (for example, three rows) will be explained with reference to FIG. 6. In the first embodiment of the present technique, the pixels other than those in the driving target rows are kept in, for example, a reset state at all times, so that excessive electrical charge is drawn.

In FIG. 5a, the horizontal direction denotes a direction indicating the temporal axis, and FIG. 5a schematically illustrates driving timing of pixels in the 14-th row (L14) to the 19-th row (L19). In FIG. 5b, the horizontal direction denotes a direction indicating the temporal axis just like FIG. 5a, and the vertical axis denotes an axis indicating a summation of counted digital values "1"s in each row (a summation of pixel output in each row), and FIG. 5b schematically illustrates a value indicating a summation of pixels that output the value "1" in each row.

In FIG. 5a, the period of time of exposure which is a period of time in which the pixels are exposed and the electrical charge is accumulated is indicated by an outlined rectangle (period of time of exposure 511). In FIG. 5a, the period of time of read-out which is a period of time from when a signal according to electrical charge accumulated in a pixel is read out from the pixel to when it is stored to the register 131 is indicated by a dark gray rectangle (the period of time of read-out 512). In FIG. 5a, the period of time of output which is a period of time in which the output circuit 150 outputs the signal stored in the register 131 is indicated by an rectangle with diagonal lines from the upper right to the lower left (period of time of output 513).

As shown in the example of timing of FIG. 5a, the image-capturing device 100 is configured to set the timing of the start and the end of the exposure so that at any given time, the pixels in five rows of the six rows are exposed. For this reason, for example, as soon as a period of time of exposure of the 15-th row (L15) ends, a subsequent period of time of exposure of the 14-th row (L14) starts. When a period of time of read-out for a read-out target row of signal (driving target row) ends, a period of time of read-out for a subsequent read-out target row starts. Further, an end time (time 521) of the period of time of read-out of pixels in the 19-th row (L19) and a start time (time 522) of the period of time of read-out of pixels in the 14-th row (L14) are substantially the same timing, so that pixels in five rows of the six rows are exposed at any given time.

Subsequently, a relationship between incidence timing (timing T1) of fluorescence (scintillation light) generated by radiation incident upon the scintillator to the image-capturing device 100 and output of the image-capturing device 100 will be explained with reference to FIG. 5a and FIG. 5b.

In this case, as shown by the incidence timing (timing T1 of fluorescence generated by radiation incident upon the scintillator to the image-capturing device 100, the following explanation is based on the assumption that the fluorescence is incident during the period of time of read-out in the 16-th row (L16).

The light incident at the timing T1 is exposed in the pixels in the rows other than the 16-th row (L16) (which are the 14-th, the 15-th, the 17-th, the 18-th, and the 19-th rows) during the period of time of read-out, and the electrical charge is accumulated, so that the pixel signal according to the electrical charge accumulated is successively output. At the timing T1, the total summation value of the output (the total summation value L16 in FIG. 5b shown in association with the time 531 in FIG. 5a) immediately after the timing T1 of the 16-th row (L16) which is the period of time of read-out is a total summation value of "0" because no electrical charge is accumulated in the pixels in the 16-th row. The total summation values in the 17-th, the 18-th, the 19-th, the 14-th, and the 15-th rows which are output subsequently (the total summation values in FIG. 5b shown in association with the times 532 to 536 in FIG. 5a) are total summation values according to the number of pixels on which the light is incident.

When the frequency of incidence of radiation upon the scintillator is once in a single exposure time, at least one row is always in the period of time of read-out at any given timing; therefore, there is a period of time in which the output value of the value "0" continues as many as the number of pixels in a row. Therefore, at the reception side that receives the output of the image-capturing device 100, the output of the image-capturing device 100 generated by the incidence of radiation upon the scintillator may be deemed a single digital pulse having a certain width. Accordingly, in the radiation detection with the scintillation using the image-capturing device 100, the number of times a pulse occurs in a single digital pulse having a certain width (digital value of value "1" for a single pixel) reflects the number of photons generated by the incidence of radiation (the number of scintillation lights). An integral value (total summation of scintillation lights) of pulses in a single digital pulse having a certain width (digital value of value "1" for a single pixel) reflects the energy of radiation.

[Example of Timing Chart in a Case where Pixels in Three Rows are Driven]

FIGS. 6a and 6b are figures schematically illustrating an example of a timing chart in a case where the image-capturing device 100 according to the first embodiment of the present technique is driven in a circulating manner with three rows.

FIGS. 6a and 6b illustrate an example in a case where pixels in three rows in the 15-th row (L15) to the 17-th row (L17) are driven. The example shown in FIGS. 6a and 6b is a modification of the example shown in FIGS. 5a and 5b, and is different only in that the number of read-out target rows is less than that of FIGS. 5a and 5b. Therefore, in the following explanation, the difference from FIGS. 5a and 5b will be focused on.

Like FIG. 5a, an example of timing shown in FIG. 6a illustrates three periods of time (a period of time of exposure, a period of time of read-out, and a period of time of output) and an optical incidence timing. The period of time of exposure (period of time of exposure 515) shown in FIG. 6a is shorter than the period of time of exposure 511 shown in FIG. 5a, and the length of the period of time is equivalent to two periods of time of read-out.

In the example of timing chart of FIG. 6a, the image-capturing device 100 is also configured to set the timing of the start and the end of the exposure so that at any given time, the pixels in two rows of the three rows are exposed.

More specifically, as soon as a period of time of read-out for the driving target row ends, a period of time of read-out for a subsequent driving target row starts, and further, when a period of time of exposure of the driving target row ends, a subsequent period of time of exposure of the previous driving target row starts.

When the circulation driving is performed with three rows as shown in FIGS. 6a and 6b, a single exposure time of each pixel is less than that of the case where the circulation driving is performed with six rows as shown in FIGS. 6a and 6b. For this reason, the frequency of exposure increases, and the temporal resolution of detection of radiation improves, so that more frequent radiation incidences can be counted. However, since only two rows are exposed (five rows in the case of FIGS. 5a and 5b), the sensitivity decreases.

As described above, according to the number of rows driven in a circulating manner, the length of the exposure time per single exposure and the frequency of exposure are determined. It should be noted that the period of time of read-out and the period of time of output are constant regardless of the increase or decrease in the number of rows driven in a circulating manner. More specifically, the image-capturing device 100 can adjust the temporal resolution and the sensitivity by just increasing or decreasing the number of rows driven in a circulating manner to change the exposure time per single exposure, the frequency of exposure, and the sensitivity of exposure.

In the explanation about FIGS. 5a to 6b, continuous rows are driven in a circulating manner, but the embodiment is not limited thereto. For example, the embodiment can be carried out in various kinds of driving patterns such as all rows, every two rows, every three rows, and the like. More specifically, the circulation driving is performed so that, at any given timing, at least a single row is in the period of time of read-out; therefore, these various kinds of driving patterns can be carried out in the same manner as FIGS. 5a to 6b.

Subsequently, with regard to the period of time of read-out, an example of more detailed operation timing than those shown in FIGS. 5a to 6b will be explained with reference to FIGS. 7 to 8b.

[Example of More Detailed Timing Chart Showing a Period of Time of Read-Out]

Figure 7:
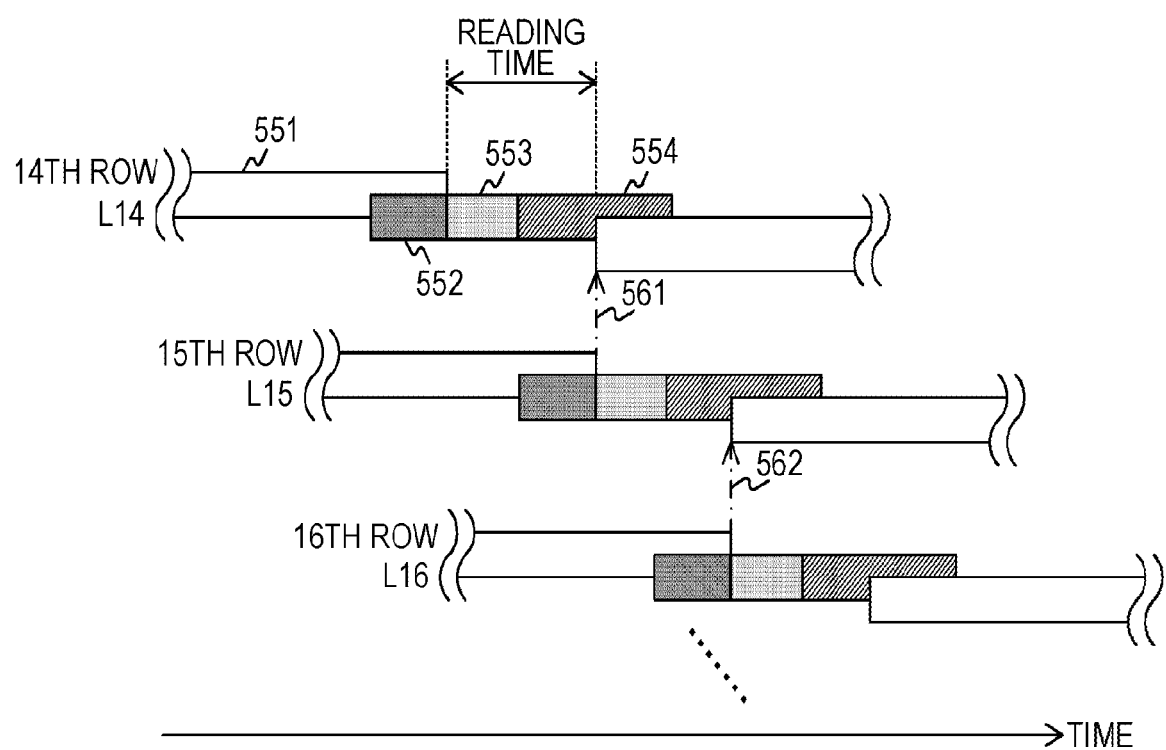
FIG. 7 is a figure schematically illustrating an example of detailed operation timing of the period of time of read-out in the image-capturing device 100 according to the first embodiment of the present technique.

FIG. 7 is a figure schematically illustrating an example of detailed operation timing of the period of time of read-out in the image-capturing device 100 according to the first embodiment of the present technique.

In FIG. 7, for example, the horizontal direction denotes a direction indicating the temporal axis, and FIG. 7 shows the period of time of read-out in the 14-th row (L14) to the 16-th row (L16).

In FIG. 7, the period of time of exposure is indicated by an outlined rectangle (period of time of exposure 551), and the period of time of reset signal processing which a period of time in which the reset signal is read out and no-signal is AD converted is indicated by a dark gray rectangle (period of time of reset signal processing 552). In FIG. 7, the period of time of accumulation signal processing which is a period of time in which the read out of the accumulation signal, the AD conversion of a difference between the accumulation signal and the reset signal, and the binary determination are performed is indicated by a light gray rectangle (period of time of accumulation signal processing 553). In FIG. 7, the period of time of output which is a period of time in which the output circuit 150 outputs the signal stored in the register 131 is indicated by an rectangle with diagonal lines from the upper right to the lower left (period of time of output 554).

As shown in FIG. 7, the image-capturing device 100 can execute the period of time of reset signal processing 552 before the end of the period of time of exposure 551. However, the period of time of accumulation signal processing 553 needs to be executed after the end of the period of time of exposure 551. For this reason, the period of time of reset signal processing 552 is performed while the period of time of exposure 551 is executed, and as soon as the period of time of exposure 551 ends, the period of time of accumulation signal processing 553 starts. Then, when the period of time of accumulation signal processing 553 ends, the period of time of output 554 starts.

When the period of time of output 554 starts, the result of the binary determination is stored in the register 131; therefore, the determination circuit 400 can be used for a subsequent row. Therefore, at a timing when a period of time of output 554 starts, a period of time of reset signal processing 552 for a subsequent row starts. Then, at a timing when a period of time of exposure 551 for the subsequent row ends, a subsequent period of time of exposure 551 for the read-out row starts.

Subsequently, a relationship between the driving timing shown in FIG. 7 and a pulse of a signal in a signal line for driving a pixel (the pixel reset line 331 and the electrical charge transfer line 332) will be explained with reference to FIGS. 8a and 8b.

FIGS. 8a and 8b are figures schematically illustrating an example of signals in signal lines (the pixel reset line 331 and the electrical charge transfer line 332) driving pixel when the image-capturing device 100 according to the first embodiment of the present technique is driven with operation timing as shown in FIG. 7.

In FIG. 8a, the horizontal direction is adopted as a common temporal axis, and FIG. 8a shows a row (row selection) which is adopted as driving target by the circulation-type address generation unit 210, and transition of potential in each signal line (the pixel reset line 331 and the electrical charge transfer line 332) driving pixel in the 14-th row. Further, FIG. 8a shows transition of the potential in each signal line driving pixel in the 15-th row and transition of the potential in each signal line driving pixel in the 16-th row.

In the explanation about this case, the control of pixel in the 14-th row is focused on. When the 14-th row is selected as the row selection, control is started to read out the accumulation signal from pixel in the 14-th row. Then, the reset pulse is provided to pixel via the pixel reset line 331, so that the potential of the floating diffusion (the FD 322 of FIG. 2) is reset (time T11 in FIG. 8a). Then, in this reset state, the read-out of the reset signal and the AD conversion of no-signal are performed.

Thereafter, at the timing when the period of time of exposure of the pixel in the 14-th row ends (time T12 in FIG. 8a), a pulse is provided from the electrical charge transfer line 332, and the electrical charge accumulated in the photodiode (photodiode 311 of FIG. 2) is transferred to the floating diffusion. Then, in this transferred state, the read-out of the accumulation signal, the AD conversion of the difference between the accumulation signal and the reset signal, and the binary determination are performed.

Then, the 15-th row is selected as the row selection, and control is started to read out the accumulation signal from pixel in the 15-th row. First, like the time T11, the reset pulse is provided to the pixel in the 15-th row, and the potential of the floating diffusion is reset (time T13 of FIG. 8a). Subsequently, at the timing when the period of time of exposure of the pixel in the 15-th row ends (time T14 of FIG. 8a), the pulse from the electrical charge transfer line 332 is provided to the pixel in the 15-th row, and the electrical charge accumulated in the photodiode is transferred to the floating diffusion.

At this time T14, the pixel reset line 331 and the electrical charge transfer line 332 of the pixel in the 14-th row provides a pulse to the pixel so that the exposure starts at the pixel in the 14-th row. More specifically, immediately before the time T14, the pulse is provided from the pixel reset line 331 and the electrical charge transfer line 332 of the pixel in the 14-th row. Therefore, the electrical charge in the photodiode and the floating diffusion of the pixel in the 14-th row is discharged, so that the pixel is reset. Then, at a timing as soon as it is the time T14, the pulse is ceased to be provided in the pixel reset line 331 and electrical charge transfer line 332 of the pixel in the 14-th row, and a subsequent exposure of the pixel in the 14-th row starts.

As indicated at the time T14, the transfer of the electrical charge accumulated in the photodiode in the driving target row and the start of a subsequent exposure in the row driven before the driving target row are performed at the same time, whereby the image-capturing device is driven so that, at any given timing, a single row is in the period of time of read-out. It should be noted that the circulation-type address generation unit 210 generates an address on the basis of a predetermined clock (a clock given by the clock generation unit 160). More specifically, all of the periods of times in which the rows are selected at the driving target row (each period of time of the 14-th row, the 15-th row, and the 16-th row in the row selection of FIG. 8a) are all the same.

The timing with which the pulse is provided is fixed as shown in FIG. 8a so that, at any given timing, one row is in the period of time of read-out. More specifically, the timing for providing each pulse in pixel reset line 331 and the electrical charge transfer line 332 can be determined by measuring the elapsed time from the timing when the row selection (driving row address) is switched (for example, a clock faster than the clock of the counter 250 is counted).

FIG. 8b showing transition of the potential in each signal line of the pixel in the 14-th row as shown in FIG. 8a (the pixel reset line 331 and the electrical charge transfer line 332) shown in association with each period of time of the pixel in the 14-th row as shown in FIG. 7. As shown in FIG. 8b, the pulse of each signal line is provided with the timing as shown in FIG. 8a, so that the pixel can be driven with the timing as shown in FIG. 7.

It should be noted that the examples of timing charts as shown in FIGS. 7 to 8b are examples of variations, and the embodiment is not limited thereto. In the basic concept, the embodiment may be configured such that, at any given timing, one row is in the period of time of read-out (the period of time in which the exposure cannot be performed), and the rows other than that is in the period of time of exposure, so that at any given timing, the same number of pixels is in the state of exposure.

Subsequently, photon counting of scintillation light using the image-capturing device 100 will be explained with reference to FIG. 9.

[Example of Sensitivity Estimation]

Figure 9:
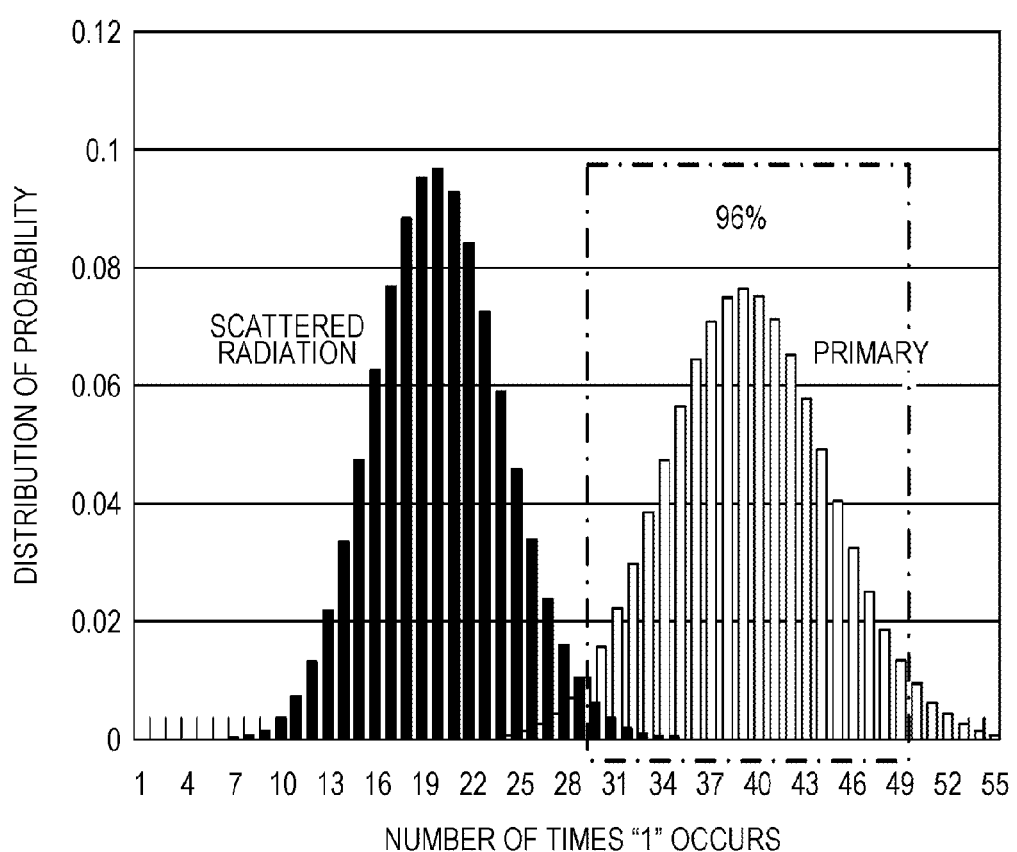
FIG. 9 is a figure for explaining photon counting of scintillation light using the image-capturing device 100 according to the first embodiment of the present technique.

FIG. 9 is a figure for explaining photon counting of scintillation light using the image-capturing device 100 according to the first embodiment of the present technique.

FIG. 9 illustrates a graph showing sensitivity estimation when light detection is performed with exposure of pixels (128 pixels) in a row.

In this case, it is considered to detect the gamma ray of technetium-99m ($^{99m}$Tc) often used as a radiopharmaceutical agent.

Technetium-99m is a radioactive substance radiating gamma ray of about 140 keV. In this case, a photon of about 140 keV (gamma ray) collides with an NaI scintillator without being scattered, and 1500 photons of these photons generated by this collision are considered to be incident upon the image-capturing device 100 in a uniform surface distribution. At this occasion, 47 photons (1500 photons/32 rows) in average are incident upon pixels in any given row, and the electrical charge is accumulated, and the photon count result obtained from this accumulation is output as the binary determination value of each pixel.

In contrast, when affected by scattering, the energy is attenuated before colliding with the NaI scintillator. As a result of the attenuation of this energy, the number of photons generated by the collision decreases. In this case, it is assumed that a single attenuated photon (gamma ray) collides with the NaI scintillator, and 700 photons of the photons generated from this collision is incident upon the image-capturing device 100 in a uniform surface distribution. At this occasion, 22 photons (700 photons/32 rows) in average are incident upon pixels in any given row, and the electrical charge is accumulated, and the photon count result obtained from this accumulation is output as the binary determination value of each pixel.

As described above, the number of times of occurrence in which the output of a pixel in each row is determined to be "1" in the binary determination (photon incidence is present) (which is 128 times at most because a single row includes 128 pixels) reflects the amount of energy of the gamma ray.

The graph in FIG. 9 is a graph estimating an occurrence frequency distribution using Poisson distribution and binominal distribution with regard to the assumption explained using the gamma ray of this technetium-99m.

In the graph of FIG. 9, the frequency distribution of the gamma ray affected by scattering (scattered gamma ray) is represented by a bar filled in black. In the graph of FIG. 9, the frequency distribution of the gamma ray not affected by scattering (primary gamma ray) is represented by an outlined bar.

As shown in FIG. 9, the frequency distribution of the scattered gamma ray and the frequency distribution of the primary gamma ray indicate completely different frequency distributions. For this reason, by using a detection result of the image-capturing device 100, whether the detected gamma ray is the scattered gamma ray or the primary gamma ray can be distinguished in a statistical manner.

For example, a case where the number of times a binary determination result of a value "1" occurs in the output of pixels (128 pixels) in a row is in the range of 29 to 49 times is determined to be deemed a detection of the primary gamma ray, and in this case, 96% of actual detection of the primary gamma ray are collected. In this determination, most of the scattered gamma ray is filtered out (excluded).

The graph as shown in FIG. 9 is a graph in a case where the image-capturing device 100 is considered to be driven so that a pixel in only a single row is exposed at any given timing (driven in a circulating manner with pixels in two rows). For this reason, the case of the graph as shown in FIG. 9 is a detection result when the sensitivity is reduced to 1/32. More specifically, in a case where the image-capturing device 100 detects the gamma ray of technetium-99m, FIG. 9 indicates that the scattered gamma ray and the primary gamma ray can be distinguished by energy discrimination even if detection is performed with exposure of a pixel in a single row.

In general, when the gamma ray from a radiopharmaceutical agent administered to a human body is detected, scintillation light is guided to a single gamma camera. The incidence frequency of the gamma ray to a scintillator of a five square centimeters (incidence event frequency) is about 1000 times per second. More specifically, the incidence frequency of the scintillation light to a single gamma ray (incidence event frequency) is about 1000 times per second.

In the case where pixels are driven in a circulating manner with pixels of five rows (pixels in four rows are exposed at the same time), the image-capturing device 100 can detect incident event of light with a cycle of 25 microseconds, and detect the incident event 40 thousand times per second ($1/25 \times 10^{-6}$). In the case where pixels are driven in a circulating manner with pixels of all the rows (32 rows) (pixels in 31 rows are exposed at the same time), the image-capturing device 100 can detect incident event of light with a cycle of 160 microseconds, and detect the incident event 6250 times per second ($1/160 \times 10^{-6}$).

As described above, the image-capturing device 100 can almost accurately measure the number of events in, e.g., the detection of gamma ray from a radiopharmaceutical agent administered to the human body.

Subsequently, the advantages of the image-capturing device 100 will be explained with reference to FIGS. 10*a* and 10*b*.

[Example of Advantages]

FIGS. 10*a* and 10*b* are figures schematically illustrating an example of the exposure operation and the read-out operation performed by the image-capturing device 100 according to the first embodiment of the present technique and an exposure operation and a read-out operation performed by another image-capturing device.

In the explanation about FIGS. 10*a* and 10*b*, pixels in some of the rows in the pixels arranged in the image-capturing device are considered to be driven.

In FIG. 10*a*, the horizontal direction is adopted as a common temporal axis, and FIG. 10*a* shows a schematic diagram (example of timing chart 581) indicating read-out timing of a signal in another image-capturing device and a graph schematically illustrating the number of counts in each row read out (graph 582).

In the example of timing chart 581, the horizontal direction denotes a direction indicating the temporal axis, and the vertical direction denotes a direction indicating a row from which signals are read out (read-out row address), and the example of timing chart 581 schematically shows a thick line (read-out timing 583) indicating read-out timing of a signal in the another image-capturing device. In addition, the example of timing chart 581 shows a both-way arrow indicating the period of time from the start to the end of an exposure (a unit period of time of exposure 584) and an arrow (arrow 585) indicating movement from the last read-out row address to the first row address of a subsequent read-out. The example of timing chart 581 also shows illumination timing of the scintillation light (time T21, time T22).

In this case, the read-out operation performed by another image-capturing device will be explained. The another image-capturing device requires a horizontal synchronization signal and a vertical synchronization signal in order to read signals from the image-capturing device. The horizontal synchronization signal is required to start the read-out of each row, and the vertical synchronization signal is required when the read-out of the final row of read-out is finished, and read-out of the first row of a subsequent read-out is started. Since the vertical synchronization signal is required, there is a waiting time from a timing when the read-out of the final row ends to a timing when the read-out of the first row of a subsequent read-out is started (for example, a difference in a time indicated by a difference between both ends of the arrow 585 in the horizontal direction).

Because this waiting time occurs, there is a period of time in which all the pixels are being exposed, and depending on the incidence timing of light of detection target, the number of pixels in period of time of exposure may change. For example, at the time T21, a pixel in a single row is likely to be in the period of time of read-out. At the time T22, all the pixels are in the period of time of exposure, and there is no row that is in the period of time of read-out. As described above, when the number of pixels in period of time of exposure changes depending on the incidence timing of light of detection target, it is difficult to perform calculation when the scattered gamma ray and the primary gamma ray are determined based on energy discrimination as shown in FIG. 9.

A number equivalent to the waiting time cannot be reduced regardless of how much the number of driving target rows is reduced. For this reason, the exposure time increases due to the waiting time (more specifically, the frame rate decreases according to the waiting time), and the incidence event of detection target light is likely to occur multiple times in a single period of time of exposure. It should be noted that, if the incidence event of detection target light occurs multiple times in a single period of time of exposure, neither the energy discrimination of the gamma ray nor the photon counting can be done.

In FIG. 10b, the horizontal direction is adopted as a common temporal axis, and FIG. 10b shows a schematic diagram (example of timing chart 591) indicating read-out timing of a signal in the image-capturing device 100 and a graph schematically illustrating the number of counts for each row read-out (graph 592). What is shown in the example of timing chart 591 and the graph 592 are the same as those shown in the example of timing chart 581 and graph 582 of FIG. 10a. More specifically, the read-out timing 593, the unit period of time of exposure 594, the arrow 595, the time T31, and the time T32 in FIG. 10b correspond to the read-out timing 583, the unit period of time of exposure 584, the arrow 585, the time T21, and the time T22, respectively, in FIG. 10a.

As shown in FIG. 1 to FIG. 9, the image-capturing device 100 is driven so that, at any given timing, the number of pixels being exposed is the same. More specifically, in the image-capturing device 100, a single row is in the period of time of read-out at any given timing, and pixels are driven so that rows other than a single row in the period of time of read-out are all in the period of time of exposure. More specifically, the waiting time that occurs in the another image-capturing device as shown in FIG. 10a does not occur, and the end timing of read out of the last row and the start timing of read-out of the first row in a subsequent read-out are at the same time (there is no difference (time difference) between both ends of the arrow 595 in the horizontal direction). For this reason, when the image-capturing device 100 is compared with the another image-capturing device, the exposure time is reduced in the image-capturing device 100, and it takes less time for the image-capturing device 100 to perform a single circulation of exposure and read-out (more specifically, the frame rate increases by the amount equivalent to the waiting time). Therefore, the exposure frequency increases, and the temporal resolution improves.

In the image-capturing device 100, the waiting time does not occur; therefore, the exposure time is determined on the basis of the read-out time and the number of driving target rows. More specifically, when the number of driving target rows becomes 1/K, then, a single operation time (exposure+read-out time) also becomes 1/K, so that although the sensitivity becomes substantially 1/K, the temporal resolution improves by substantially K times. As described above, in the image-capturing device 100, the sensitivity and the temporal resolution are in tradeoff relationship. However, in the image-capturing device 100, the number of driving target rows can be freely set by designating the start and end row addresses; therefore, the sensitivity and the temporal resolution can be adjusted optimally in accordance with the incidence frequency of the gamma ray of detection target to the scintillator.

In the image-capturing device 100, at any given timing, the number of rows being exposed is the same; therefore, when a single row is defined as a group (section), a single light receiving surface may be considered to be divided into multiple groups. When the light is uniformly incident upon the light receiving surface, the number of rows being exposed is the same at any given timing, and the number of pixels in each row (group) is the same; therefore, the output of each row may be considered to reflect the quantity of light incidence to the entire light receiving surface (image-capturing device 100).

More specifically, the scintillation light can be appropriately detected by using the image-capturing device 100.

Subsequently, an apparatus having the image-capturing device 100 will be explained with reference to FIGS. 11a and 11b.

[Example of Apparatus Having Image-Capturing Device 100]

FIGS. 11a and 11b are figures schematically illustrating an example of a detection apparatus (detection apparatus 600) having the image-capturing device 100 according to the first embodiment of the present technique and an example of a conventional detection apparatus having a photomultiplier.

In this case, for example, a detector of gamma ray in a SPECT (Single Photon Emission Computed Tomography) apparatus will be considered. The SPECT apparatus is used such that a very tiny amount of gamma ray source such as technetium is introduced into the body, and the distribution of the gamma ray source in the body is derived from positional information about the radiated gamma ray. It should be noted that the basic configuration and the signal processing content of the SPECT apparatus are already known (for example, see Japanese Patent Laid-Open No. 2006-242958, Japanese Translation of PCT Application No. 2006-508344), and the present technique relates to the detection unit of the gamma ray; therefore detailed explanation thereabout is omitted here.

FIG. 11a illustrates an example of a conventional detection apparatus having a photomultiplier. To detect the gamma ray, an apparatus including a combination of a scintillator and a photomultiplier is used in the past as shown in FIG. 11a.

FIG. 11a illustrates a collimator 691, a scintillator 692, a photomultiplier 693, a conversion unit 694, and a data processing unit 695, which are the configuration of the conventional detection apparatus for detecting the gamma ray source (gamma ray source 681) retrieved into the human body (human body 680).

The collimator 691 only passes the gamma ray incident vertically upon the incidence surface of the gamma ray of the scintillator 692, and shields the gamma ray incident thereon in a diagonal direction. The collimator 691 is constituted by, for example, a lead plate having many small holes formed therein.

The scintillator 692 absorbs the energy of electron ray, electromagnetic wave, and the like, and emits fluorescence. For example, thallium doped sodium iodide (NaI (Tl)) is used as the scintillator 692 for detecting the gamma ray.

The photomultiplier 693 multiplies electrons generated by the photoelectric conversion by using electron avalanche, and outputs an amplified result as an analog pulse. This photomultiplier 693 requires a high voltage for accelerating electrons in order to amplify the electrons. The photomultiplier 693 provides the generated analog pulse (analog signal) to the conversion unit 694. In the SPECT apparatus, several dozen photomultipliers 693 are arranged in parallel. In FIG. 11*a*, three photomultipliers 693 are schematically shown.

The conversion unit 694 digitally converts the analog pulse provided from the photomultiplier 693, and outputs it as a digital value in each sampling section. This conversion unit 694 is provided for each photomultiplier 693. The conversion unit 694 provides the digital value to the data processing unit 695.

The data processing unit 695 analyzes the detection target on the basis of the digital value provided from the conversion unit 694. For example, the data processing unit 695 identifies the energy of the gamma ray from the total summation of the output of the incidence events of the scintillation light occurring at a time on the basis of the digital value which is output from the conversion unit 694. The data processing unit 695 identifies the incidence position of the gamma ray from the barycenter of the output of the incidence events occurring at a time.

As described above, most of conventional detection apparatuses are mainly those having photomultipliers. Alternatively, a detection apparatus may be made using a special semiconductor such as cadmium telluride (CdTe). However, in any of them, the detection device is extremely expensive; therefore, when a detector is made using many detection devices, a very high cost is required with only the detector. Further, the output of such detector is an analog pulse; therefore, an external apparatus is required to analyze the pulse height of the output at a high speed (e.g., measure, discriminate, count the number of pulses, and the like). For example, in the case of FIG. 11*a*, as many conversion units 694 as the number of photomultipliers 693 are required. In addition, strict countermeasure for circuit noises is also required. For this reason, when a detector is constituted by arranging many detection devices used in the past such as a photomultiplier and cadmium telluride, the size of the external apparatus increases, and the cost and the size of the radiation image-capturing apparatus increase.

FIG. 11*b* illustrates an example of a detection apparatus (detection apparatus 600) having an image-capturing device 100.

FIG. 11*b* shows a collimator 691, a scintillator 692, an optical guide unit 610, an image-capturing device 100, and a data processing unit 620, which are the configuration of the detection apparatus 600. The collimator 691 and the scintillator 692 are the same as those shown in FIG. 11*a*; therefore, explanation thereabout is omitted here. In the image-capturing device 100, three photomultipliers 693 of several dozen photomultipliers arranged therein are schematically shown in FIG. 11*b*.

The optical guide unit 610 has a function (optical guide function) for condensing the scintillation light generated by the scintillator 692 and guiding the condensed scintillation light to the image-capturing device 100. The optical guide unit 610 has a light uniformization function for substantially uniformizing the distribution of the scintillation light incident upon the optical guide unit 610, and is configured to emit the substantially uniformized scintillation light to the pixel array of the image-capturing device 100. More specifically, the optical guide unit 610 has a role of distributing the scintillation light which is incident upon the incidence surface (junction surface with the scintillator 692 of the optical guide unit 610) in a non-uniform distribution, so that the same number of scintillation light is incident upon each pixel of the pixel array of the image-capturing device 100.

The optical guide unit 610 is made of, for example, a kaleidoscope using reflection, an integrated lens such as fly-eye lens having small lenses filled therein, a diffractive optical element (DOE) using detraction, and an optical scattering material made by doping small particles and dots scattering light into glass or resin.

Alternatively, the optical guide unit 610 may be made of an optical fiber having light uniformization function and a light guiding having multiple optical fibers having light uniformization functions bound therein.

The data processing unit 620 is configured to analyze the detection target on the basis of the digital value provided from the image-capturing device 100. It should be noted that the data processing unit 620 is the same as the data processing unit 695 except that the source of the digital value is different; therefore detailed explanation thereabout is omitted here.

In this case, the detection of the gamma ray emitted from the gamma ray source 681 will be explained. FIG. 11*b* shows an arrow (arrow 682) indicating the trace of a non-scattered gamma ray (primary gamma ray) of radiated gamma rays to the scintillator 692, and an arrow (arrow 683) indicating the trace of a gamma ray being affected by scattering (scattered gamma ray) to the scintillator 692.

As shown by the arrow 682, the primary gamma ray detected by the detection apparatus is radiated from the gamma ray source 681 and incident upon the scintillator 692 without its straight path being blocked. Therefore, the scintillation light generated by the primary gamma ray has a quantity of light reflecting the energy of the primary gamma ray.

On the other hand, the scattered gamma ray detected by the detection apparatus is a gamma ray which is radiated from the gamma ray source 681, thereafter colliding with electron and which is scattered (Compton scattered), and is a gamma ray incident upon the scintillator 692 vertically as shown in arrow 683. This scattered gamma ray is information that becomes noise and has lost original positional information, and has less energy than the primary gamma ray.

The detection apparatus detects not only the primary gamma ray and the scattered gamma ray but also noises from which abnormally high energy is detected such as cosmetic radiation.

As described above, since not only the target gamma ray but also gamma rays that becomes noises are detected, the SPECT apparatus filters a signal of noise in the detected signal and a signal of the primary gamma ray by using energy discrimination. More specifically, the data processing unit 620 performs noise determination based on energy discrimination and positional determination of the radiation source for each gamma ray detected on the basis of the output (digital signal) from each image-capturing device 100.

In a case where the scintillator 692 is a single plate that is not divided into sections, the scintillation light is incident upon multiple optical guide units 610 to be detected by multiple image-capturing devices 100. The data processing unit 620 identifies the amount of energy of the gamma ray from the total summation of binary determination values having value "1" detected at a time, and identifies the detection result of the primary gamma ray from the identified amount of energy. Then, the data processing unit 620 identifies the incidence position of the gamma ray from the barycenter position of the binary determination values having value "1" in the detection result of the primary gamma ray. In this manner, the detection result of the primary gamma ray is accumulated, and the distribution of the gamma ray source in the body is identified.

It should be noted that the image-capturing device 100 is smaller, lighter, and less expensive than the photomultiplier tube (PMT); therefore, many image-capturing devices 100 can be implemented with a higher density. For this reason, the resolution of the positional detection becomes higher when many image-capturing devices 100 are implemented with a high density. When many image-capturing devices 100 are implemented with a high density, this significantly appears in the strength distribution of the output when multiple gamma rays are incident on different positions at a time. Therefore, they can be determined using pattern matching and the like and can be detected with a high degree of accuracy.

[Example of Operation of Image-Capturing Device]

Subsequently, operation performed by the image-capturing device 100 to detect scintillation light according to the first embodiment of the present technique will be explained with reference to drawings.

Figure 12:
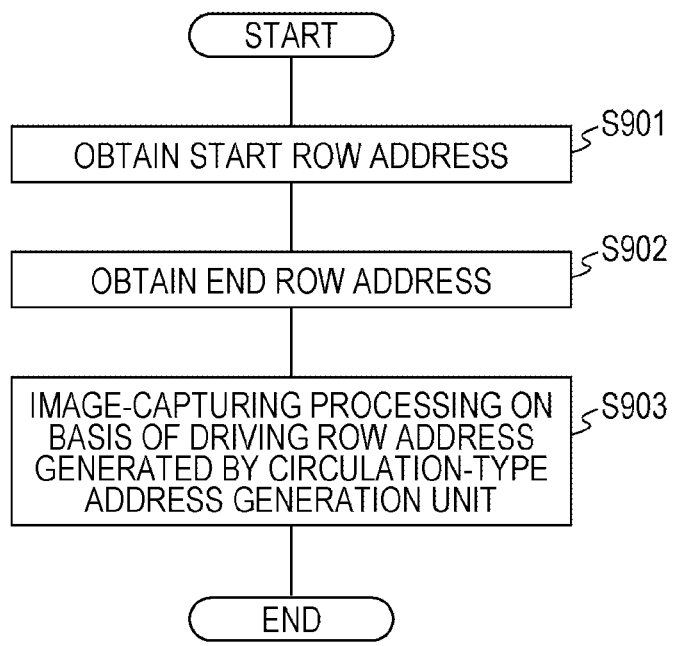
FIG. 12 is a flowchart illustrating an example of processing procedure when the image-capturing device 100 according to the first embodiment of the present technique performs image-capturing.

FIG. 12 is a flowchart illustrating an example of processing procedure when the image-capturing device 100 according to the first embodiment of the present technique performs image-capturing.

In the explanation about FIG. 12, it is assumed that a control unit of an apparatus provided with the image-capturing device 100 determines the exposure frequency, determines the number of rows of driving target pixels according to this exposure frequency, and determines the start row address and the end row address according to the number of rows. More specifically, it is assumed that information about the determined end row address and start row address to the signal line 291 and the signal line 292.

First, the start row address is obtained by the start row address register 220 (step S901). The end row address is obtained by the end row address register 230 (step S902).

Then, on the basis of the obtained start row address and end row address, the address of driving target row (driving row address) is generated by the circulation-type address generation unit 210, and on the basis of this generated driving row address, the image-capturing processing is performed (step S903).

As described above, according to the first embodiment of the present technique, at any given timing, the number of pixels being exposed can be the same, and the frame rate is increased, so that the temporal resolution can be improved. More specifically, according to the first embodiment of the present technique, pixels appropriate for photon counting can be drive.

2. Second Embodiment

In the explanation about the first embodiment of the present technique, the circulation driving of the image-capturing device 100 is focused on. An image-capturing device 100 can adjust the temporal resolution and the sensitivity of light detection by adjusting the difference between the start row address and the end row address and dynamically changing the number of rows (groups) driven in a circulating manner.

Since the temporal resolution and the sensitivity are in tradeoff relationship, it is convenient if an apparatus having the image-capturing device 100 (for example, a radiation detection device) has an automatic exposure (AE) mechanism.

Therefore, in the second embodiment of the present technique, the automatic exposure mechanism for the image-capturing device 100 will be explained with reference to FIGS. 13 to 14.

In the second embodiment of the present technique, an example having a single scintillator provided in a single image-capturing device 100 will be shown in an example of a detection apparatus (detection apparatus 700) detecting light using the image-capturing device 100. More specifically, in this case, an example of another detection apparatus will be shown, which is different from the example where the single plate scintillator is shared by multiple image-capturing devices 100 as shown in FIG. 11b.

[Example of Configuration of Functions of Detection Apparatus]

Figure 13:
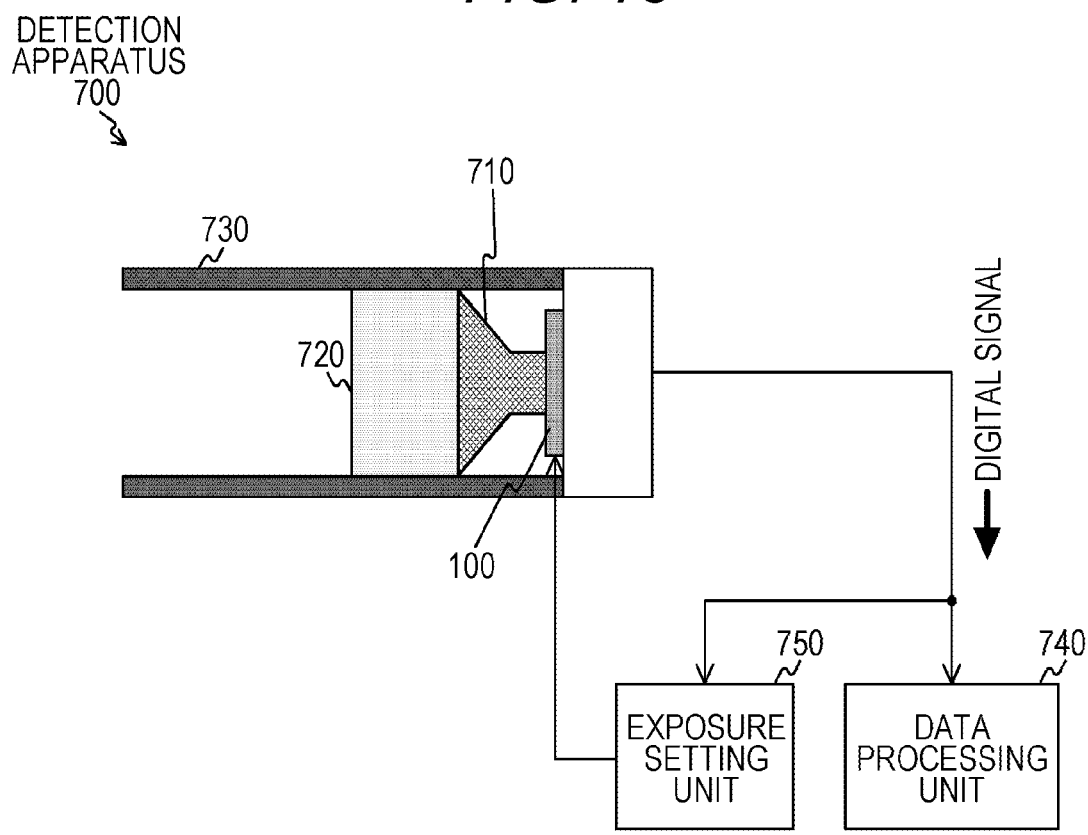
FIG. 13 is a figure schematically illustrating an example of a detection apparatus (detection apparatus 700) according to a second embodiment of the present technique.

FIG. 13 is a figure schematically illustrating an example of a detection apparatus (detection apparatus 700) according to the second embodiment of the present technique.

The detection apparatus 700 includes a collimator 730, a scintillator 720, an optical guide unit 710, an image-capturing device 100, a data processing unit 740, and an exposure setting unit 750. Each configuration other than the exposure setting unit 750 respectively corresponds to those shown in FIG. 11b.

More specifically, in the detection apparatus 700, scintillation light from a single scintillator is guided to a single image-capturing device. When the detection apparatuses 700 are provided in, e.g., a SPECT apparatus, a PET apparatus, a mammography, an X ray detection apparatus such as a CT apparatus, many detection apparatuses 700 are arranged in an array form.

As described above, the spatial resolution can be improved by arranging, in the array form, many detection apparatuses 700 having a scintillator sectioned to correspond to each image-capturing device (a scintillator is surrounded by a collimator).

The exposure setting unit 750 is configured to set an appropriate exposure (exposure) time on the basis of a digital value provided from the image-capturing device 100. This exposure setting unit 750 changes the number of driving target rows by changing the start row address and the end row address provided to the image-capturing device 100, and thus controlling the time of exposure in the image-capturing device 100. When the exposure setting unit 750 detects the start row address and end row address for attaining appropriate exposure, the exposure setting unit 750 terminates the automatic exposure. It should be noted that the automatic exposure will be explained with reference to FIGS. 14 and 15; therefore detailed explanation thereabout is omitted here. The exposure setting unit 750 provides the start row address and end row address via the signal line 290 to the circulation-type address generation unit 210 of the image-capturing device 100.

[Example of Operation of Detection Apparatus]

Subsequently, operation of the automatic exposure performed by the detection apparatus 700 according to the second embodiment of the present technique will be explained with reference to drawings.

Figure 14:
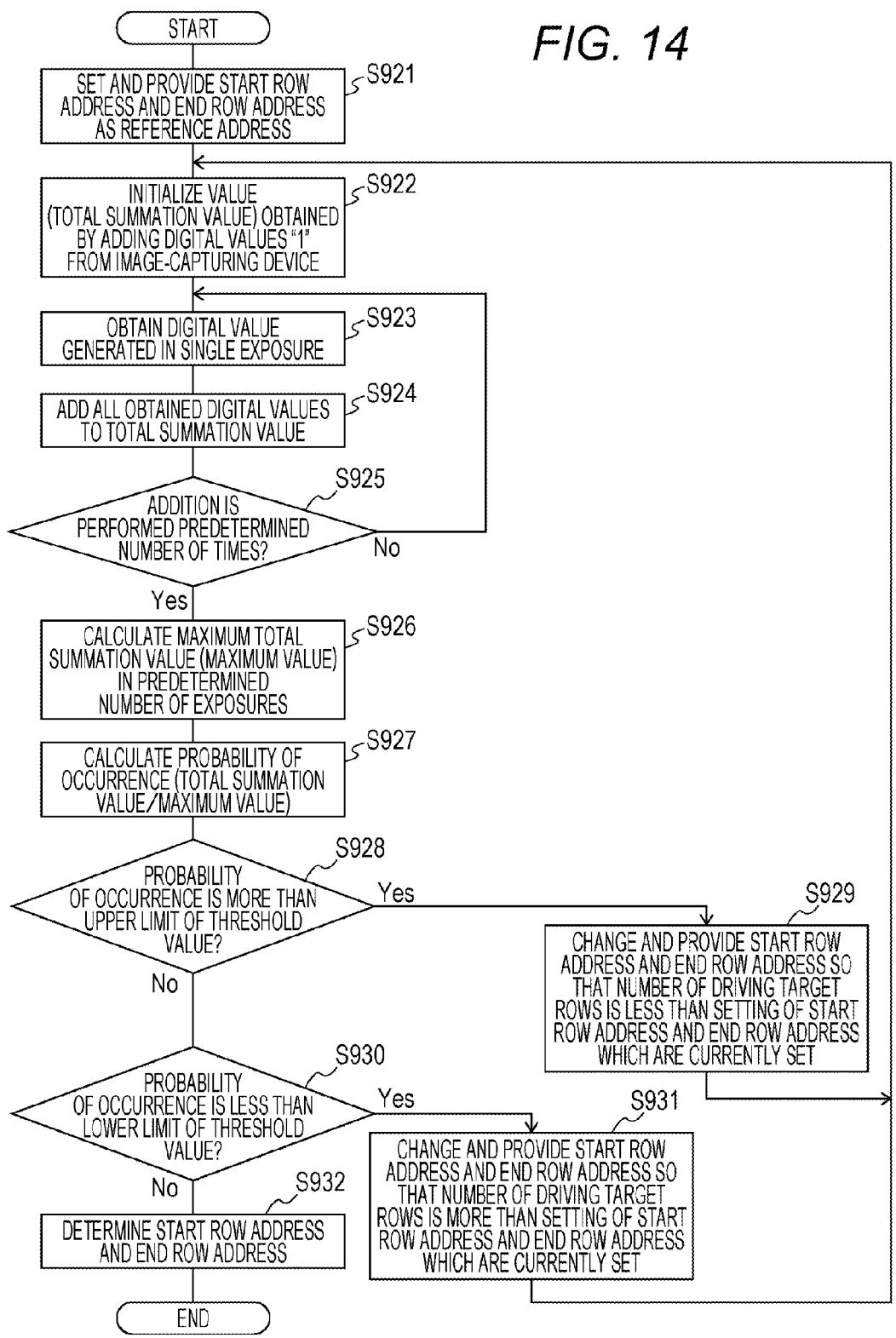
FIG. 14 is a flowchart illustrating an example of processing procedure when the detection apparatus 700 according to the second embodiment of the present technique performs automatic exposure.

FIG. 14 is a flowchart illustrating an example of processing procedure when the detection apparatus 700 according to the second embodiment of the present technique performs automatic exposure. Each processing procedure shown here is performed by the exposure setting unit 750.

First, the start row address and end row address serving as a reference for determining the exposure are provided to the image-capturing device 100 (step S921). Subsequently, a count of a value (total summation value) obtained by adding digital values ("0" or "1") given by the image-capturing device 100 is initialized with a value "0" (step S922).

Thereafter, the digital values which are output from the image-capturing device 100 detecting a sample by a single exposure (driving) based on the provided start row address and end row address (the output of each pixel in rows from the start row address to the end row address) are obtained (step S923) are obtained. Subsequently, all the obtained digital values (all the output of the pixels in the rows from the start row address to the end row address) are added to the total summation value (step S924). Thereafter, a determination is made as to whether the addition of the obtained digital values to the total summation value is performed a predetermined number of times (step S925). When the addition is determined not to be performed the predetermined number of times (step S925), step S923 is performed again.

On the other hand, when the addition is determined to be performed the predetermined number of times (step S925), the maximum total summation value (the maximum value) of a predetermined number of exposures is derived (step S926). For example, when 128 pixels generate digital values in a single exposure (circulation driving with two rows), and the addition is performed 100 times, the maximum value is 12800 (128×100).

Then, on the basis of the total summation value and the maximum value, the probability of occurrence of incidence event of scintillation light is calculated (step S927). Thereafter, a determination is made as to whether the probability of occurrence thus calculated is more than the upper limit threshold value or not (step S928).

Then, when the probability of occurrence is determined to be more than the upper limit threshold value (step S928), the start row address and end row address are changed so that the number of rows driven in a circulating manner is less than the number of rows from start row address to the end row address which are currently set (step S929). The start row address and the end row address thus changed are provided to the image-capturing device 100 (step S929), and subsequently step S922 is performed again.

On the other hand, when the probability of occurrence is determined to be less than the upper limit threshold value (step S928), a determination is made as to whether the probability of occurrence is less than the lower limit threshold value or not (step S930). Then, when the probability of occurrence is determined to be less than the lower limit threshold value (step S930), the start row address and end row address are changed so that the number of rows driven in a circulating manner is more than the number of rows from start row address to the end row address which are currently set (step S931). The start row address and end row address thus change are provided to the image-capturing device 100 (step S931), and step S922 is performed again.

When the probability of occurrence is determined to be more than the lower limit threshold value (step S930), it is determined that the gamma ray of the sample is detected under the current setting (from the start row address to the end row address), and the start row address and end row address currently set are provided to the image-capturing device 100 (step S932). Then, after step S932, the processing procedure of the automatic exposure is terminated.

Step S928 to step S931 will be hereinafter explained. The case where the probability of occurrence is determined to be more than the upper limit threshold value in step S928 is a case where the number of scintillation lights (the number of gamma rays) detected in a predetermined number of exposures with an exposure time (temporal resolution) using the number of rows driven in a circulating manner under the current setting is too high. Therefore, in step S929, the number of rows driven in a circulating manner is decreased so as to reduce the exposure time and improve the temporal resolution. Accordingly, it takes a shorter time to perform the predetermined number of detections, and the number of scintillation lights (the number of gamma rays) incident within this time decreases, and the probability of occurrence decreases.

The case where the probability of occurrence is determined to be less than the lower limit threshold value in step S930 is a case where the number of scintillation lights (the number of gamma rays) detected in a predetermined number of exposures with an exposure time (temporal resolution) using the number of rows driven in a circulating manner under the current setting is too low. Therefore, in step S931, the number of rows driven in a circulating manner is increased so as to increase the exposure time. Accordingly, it takes a longer time to perform the predetermined number of detections, and the number of scintillation lights (the number of gamma rays) incident within this time increases, and the probability of occurrence increases. Since the number of rows driven in a circulating manner is increased, the temporal resolution decreases but the detection precision increases, so that the energy resolution (detection precision) improves.

As described above, in the second embodiment of the present technique, the number of rows (exposures) of driving target is adjusted so that the probability of occurrence stays within a predetermined range (between the upper limit threshold value and the lower limit threshold value). More specifically, in the second embodiment of the present technique, the start row address and end row address provided from the exposure setting unit 750 to the image-capturing device 100 can be automatically set according to samples.

This automatic exposure adjustment can be executed dynamically and independently for each image-capturing device 100. More specifically, in an apparatus provided with multiple image-capturing devices 100 in a detection unit, the automatic exposure adjustment is done individually, so that the quality of the image-capturing can be greatly improved. When the image-capturing device 100 is used alone, detection with a high precision under low level radiation and a high dynamic range in which the measurement does not go beyond the scale under high level radiation can be achieved at the same time.

As described above, according to the second embodiment of the present technique, operation of the image-capturing device for photon counting receiving the scintillation light can be determined by the automatic exposure.

As described above, according to the embodiment of the present technique, the temporal resolution can be improved.

In particular, an extremely high frame rate can be set; therefore, an extremely high temporal resolution can be obtained. Since CMOS image sensors are used, they can be mass-produced at a low cost, many optical detection units can be provided in an electronic device that could be provided with a small number of optical detection units because of the high cost of the photomultiplier; therefore, the detection speed can be improved.

The image-capturing device shown in the embodiment of the present technique can be widely applied as an optical detection unit in a conventional electronic device provided with photomultipliers, avalanche photodiodes, photodiodes, or the like.

In the embodiment of the present technique, the example where the number of exposure pixels becomes constant at any given timing with the circulation-type address generation unit 210 has been explained, but the embodiment is not limited thereto. If a generally-available ordinary CMOS image sensor can be driven in this manner, the embodiment can also be carried out in the same manner. In the explanation, photon counting is assumed, but when an extremely high sensitivity is not required, a CMOS sensor having an ordinary sensitivity may perform the same operation as the embodiment of the present technique.

It should be noted that the embodiment of the present technique can be realized in not only the apparatus explained above but also a small and lightweight handheld dosimeter having an extremely high sensitivity using a low-cost semiconductor image-capturing device. Even in this case, the energy detection of radiation and the photon counting can be done at a time; therefore, for example, a count rate according to the energy of radiation, i.e., the energy spectrum of radiation, can be measured. More specifically, radiation dose correction (for example, see Japanese Patent Laid-Open No. 2004-108796) according to G(E) function method, DBM method, and the like can be carried out appropriately. Since the output of the image-capturing device 100 is a digital value, it is not necessary to have a multi-channel analyzer that was necessary with a conventional detection device (for example, photomultiplier). For this reason, when the image-capturing device 100 is used, all the post processing including correction can be done with a low-cost single-chip microcomputer. More specifically, when the image-capturing device 100 is used, a small, lightweight, and low-cost dosimeter having a high degree of precision can be realized.

In the embodiment of the present technique, it is assumed that the gamma ray is measured by detecting the scintillation light. But the embodiment of the present technique is not limited thereto. The embodiment of the present technique can be applied to, e.g., an apparatus for detecting weak fluorescence. In fluorescence observation, when an excitation light is emitted in a pulse manner, a pulse-like fluorescence is generated from a fluorescent body. When the temporal resolution of detection can be improved using the present invention, fluorescence detection can be carried out while more inspection portions are scanned due to the higher temporal resolution, and the throughput of observation can be greatly improved. Therefore, a light detection apparatus using the present invention can also be used as a fluorescent scanner for a DNA chip and a light detector for an optically stimulated luminescence detection scanner of an image plate.

In the explanation about the embodiment of the present technique, it is assumed that interlaced driving is not performed. When interlaced driving is performed, the counter 250 of FIG. 4 may provide a driving row address by increasing counts by two in response to a clock provided from the clock generation unit 160 (interlacing by one row), or may provide a driving row address by increasing counts by three.

The above embodiments are an example for embodying the present technique. The matters in the embodiment and the invention-specifying matters in the claims are related to each other. Likewise, the invention-specifying matters in the claims and the matters in the embodiments of the present technique denoted with the same names as the invention-specifying matters are related to each other. However, the present technique is not limited to the embodiments. The embodiments can be carried out by applying various modifications to the embodiment without deviating from the gist.

The processing procedure explained in the above embodiments may be understood as the method having the series of procedure, and may be understood as a program for causing a computer to execute the series of procedure or a recording medium storing the program. Examples of recording media include a hard disk, a CD (Compact Disc), an MD (Mini-Disc), a DVD (Digital Versatile Disk), a memory card, a Blu-ray Disc (registered trademark)), and the like.

It should be noted that the present technique may also be configured as follows.

(1) An image-capturing device including:
a pixel array unit including a plurality of pixels classified into two or more groups, wherein pixels which belong to a same group are driven at a same timing; and
a control unit configured to control driving of the pixel array unit so that a number of groups in a period of time of read-out of electrical charge is a same number in any given timing in image-capturing operation, and that a number of groups in a period of time of exposure and accumulation of electrical charge is a same number in any given timing in the image-capturing operation.

(2) The image-capturing device according to (1), wherein the group is such that a number of pixels which belong to the group is substantially the same as the number of pixels which belong to another group.

(3) The image-capturing device according to (1) or (2), wherein the plurality of pixels are arranged in a row/column form in the pixel array unit and driven in a unit of row, and
the control unit performs the control with the row being adopted as a unit of the group.

(4) The image-capturing device according to (3), wherein the control unit updates a driving row address for designating a driving target row on every predetermined period of time, and performs the control on the basis of update timing of the driving row address thus updated.

(5) The image-capturing device according to (4), wherein the control unit updates the driving row address with a row address of a start of driving in a case where the update is performed in a state where the driving row address indicates a row address of an end of driving, on the basis of start row address information indicating the row address of the start of the driving and end row address information indicating the row address of the end of the driving.

(6) The image-capturing device according to (5), wherein the control unit performs the control so that an end timing of exposure in a driving target row in a current read-out operation and a start timing of a subsequent exposure in the driving target row in a previous read-out operation are substantially the same timing.

(7) The image-capturing device according to (6), further including a determination unit configured to convert a pixel signal which is output from the pixel into a digital value, compare the converted digital value with a threshold value, and performs binary determination to determine presence/absence of incidence of a photon onto a pixel generating the pixel signal.

(8) The image-capturing device according to (1), wherein the pixel array unit receives light that is uniformized by a light uniformization unit for substantially uniformizing distribution of incidence light, which is a detection target of the number of photons, in a direction perpendicular to an optical axis.

(9) An electronic device including:

a pixel array unit including a plurality of pixels classified into two or more groups, wherein pixels which belong to a same group are driven at a same timing; and a control unit configured to control driving of the pixel array unit so that a number of groups in a period of time of read-out of electrical charge is a same number in any given timing in image-capturing operation, and that a number of groups in a period of time of exposure and accumulation of electrical charge is a same number in any given timing in the image-capturing operation.

(10) The electronic device according to (9), further including:

a scintillator configured to provide scintillation light generated in response to incidence of radiation to the pixel array unit;

a determination unit configured to convert a pixel signal which is output from the pixel into a digital value, compared the converted digital value with a threshold value, and perform binary determination to determine presence/absence of incidence of a photon onto a pixel generating the pixel signal; and a calculation unit configured to derive a summation of binary values which are results of the binary determinations, for each of scintillation lights detected substantially at the same timing, and calculate an amount of energy of the radiation from the summation value.

REFERENCE SIGNS LIST

100 Image-capturing device
110 Vertical driving circuit
130 Read-out circuit
131 Register
140 Horizontal driving circuit
150 Output circuit
160 Clock generation unit
210 Circulation-type address generation unit
220 Start row address register
230 End row address register
240 Comparator
250 Counter
300 Pixel array unit
310 Pixel
400 Determination circuit

The invention claimed is:

1. An image-capturing device comprising:
a pixel array unit including a plurality of pixels classified into two or more groups, wherein pixels which belong to a same group are driven at a same timing; and
a control unit configured to control driving of the pixel array unit so that a number of groups in a period of time of read-out of electrical charge is a same number in any given timing in image-capturing operation, and that a number of groups in a period of time of exposure and accumulation of electrical charge is a same number in any given timing in the image-capturing operation.

2. The image-capturing device according to claim 1, wherein the group is such that a number of pixels which belong to the group is substantially the same as the number of pixels which belong to another group.

3. The image-capturing device according to claim 2, wherein the plurality of pixels are arranged in a row/column form in the pixel array unit and driven in a unit of row, and
the control unit performs the control with the row being adopted as a unit of the group.

4. The image-capturing device according to claim 3, wherein the control unit updates a driving row address for designating a driving target row on every predetermined period of time, and performs the control on the basis of update timing of the driving row address thus updated.

5. The image-capturing device according to claim 4, wherein the control unit updates the driving row address with a row address of a start of driving in a case where the update is performed in a state where the driving row address indicates a row address of an end of driving, on the basis of start row address information indicating the row address of the start of the driving and end row address information indicating the row address of the end of the driving.

6. The image-capturing device according to claim 5, wherein the control unit performs the control so that an end timing of exposure in a driving target row in a current read-out operation and a start timing of a subsequent exposure in the driving target row in a previous read-out operation are substantially the same timing.

7. The image-capturing device according to claim 6, further comprising a determination unit configured to convert a pixel signal which is output from the pixel into a digital value, compare the converted digital value with a threshold value, and performs binary determination to determine presence/absence of incidence of a photon onto a pixel generating the pixel signal.

8. The image-capturing device according to claim 1, wherein the pixel array unit receives light that is uniformized by a light uniformization unit for substantially uniformizing distribution of incidence light, which is a detection target of the number of photons, in a direction perpendicular to an optical axis.

* * * * *